(12) United States Patent
Matsumoto et al.

(10) Patent No.: US 7,554,427 B2
(45) Date of Patent: Jun. 30, 2009

(54) THIN FILM BULK ACOUSTIC WAVE RESONATOR AND FILTER, AND RADIO FREQUENCY MODULE USING THEM

(75) Inventors: Hisanori Matsumoto, Kokubunji (JP); Atsushi Isobe, Kodaira (JP); Kengo Asai, Hachioji (JP)

(73) Assignee: Hitachi Media Electronics Co., Ltd., Oshu, Iwate (JP)

( * ) Notice: Subject to any disclaimer, the term of this patent is extended or adjusted under 35 U.S.C. 154(b) by 161 days.

(21) Appl. No.: 11/705,520

(22) Filed: Feb. 13, 2007

(65) Prior Publication Data

US 2008/0169884 A1 Jul. 17, 2008

(30) Foreign Application Priority Data

Jan. 15, 2007 (JP) ............... 2007-006102

(51) Int. Cl.
*H03H 9/54* (2006.01)
*H01L 41/047* (2006.01)
(52) U.S. Cl. .............. 333/187; 310/313 A; 310/366; 333/191
(58) Field of Classification Search ............. 333/187, 333/133, 189, 191; 310/313 A, 366
See application file for complete search history.

(56) References Cited

U.S. PATENT DOCUMENTS

| 5,587,620 | A | 12/1996 | Ruby et al. |
| 7,019,605 | B2 | 3/2006 | Larson, III |
| 7,038,559 | B2 | 5/2006 | Ruby et al. |
| 2004/0135144 | A1* | 7/2004 | Yamada et al. ............ 257/59 |
| 2006/0267710 | A1* | 11/2006 | Matsumoto et al. ....... 333/187 |
| 2007/0080611 | A1* | 4/2007 | Yamada et al. ........... 310/364 |

FOREIGN PATENT DOCUMENTS

| JP | 2005-137002 A | 5/2005 |
| JP | 2005-244966 A | 9/2005 |

OTHER PUBLICATIONS

R. Ruby et al., "PCS 1900 MHz Duplexer Using Thin Film Bulk Acoustic Resonators (FBARs)", Electronics Letters, vol. 35, pp. 794-795, May 1999.

* cited by examiner

*Primary Examiner*—Daniel D Chang
(74) *Attorney, Agent, or Firm*—Miles & Stockbridge P.C.

(57) ABSTRACT

A thin film bulk acoustic wave (BAW) resonator structure and filter which can be fabricated by inexpensive manufacturing techniques and in smaller size than conventional such products are to be provided. The BAW resonator structure and filter have a substrate, a first BAW resonator placed over the substrate, an acoustic reflection layer placed over the first BAW resonator and a second BAW resonator placed over the acoustic reflection layer, and the acoustic reflection layer is electroconductive. Herein, the acoustic reflection layer constitutes a first electrode, and this first electrode electrically connects and acoustically separates the first BAW resonator and the second BAW resonator.

2 Claims, 19 Drawing Sheets

SERIES RESONATOR  +  SHUNT RESONATOR  =  FILTER

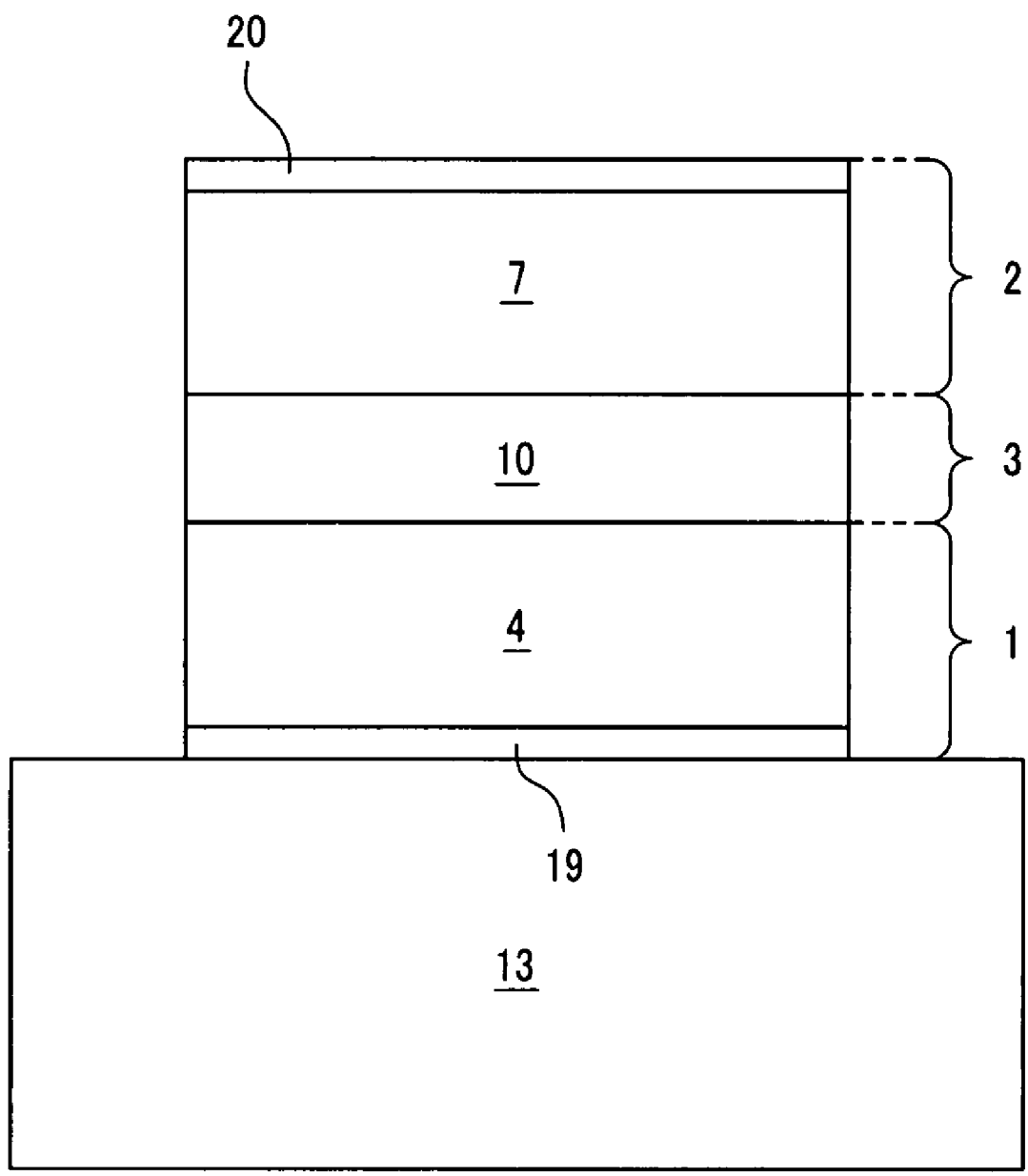

THIN FILM BULK ACOUSTIC WAVE RESONATOR AND FILTER, AND RADIO FREQUENCY MODULE USING THEM

CLAIM OF PRIORITY

The present invention application claims priority from Japanese application JP2007-6102 filed on Jan. 15, 2007, the content of which is hereby incorporated by reference into this application.

FIELD OF THE INVENTION

The present invention relates to a thin film bulk acoustic wave resonator (BAW resonator) structure and a bulk acoustic wave filter (BAW filter), and a radio-frequency module using them.

BACKGROUND OF THE INVENTION

BAW resonators are applicable to frequency bands of a few hundred MHz to more than 10 GHz, and examples of their application include the use of BAW resonators in the configuration of a radio-frequency filter in a mobile communication system such as mobile telephones (see, for instance, Electronics Letters, Vol. 35, pp. 794-795, 1999).

Known techniques for downsizing BAW resonators and filters include one by which BAW resonators are divided in the perpendicular direction (see U.S. Pat. No. 7,038,559 B2).

Also, U.S. Pat. No. 7,019,605 B2 contains the following statement regarding U.S. Pat. No. 5,587,620 quoted in it, with reference to FIG. 3: "The SBAR shown in FIG. 3 can be regarded as being composed of two FBARs, one stacked on top of the other. One of the FBARs is composed of piezoelectric layer 22 sandwiched between electrodes 24 and 26. The other of the FBARs is composed of piezoelectric layer 42 sandwiched between electrodes 26 and 44. Electrode 26 common to both FBARs provides close coupling of acoustic energy between the FBARs."

SUMMARY OF THE INVENTION

Along with the progress of technology for mobile communication systems including mobile telephones, smaller and less costly radio-frequency filters subject to a low insertion loss and having a wide pass band are called for.

A BAW resonator can be regarded as a capacitor at a frequency sufficiently far from its resonance frequency, and its capacitance is determined by the dielectric constant of the piezoelectric layer, the film thickness of the piezoelectric layer and the square measure of the BAW resonator. As the dielectric constant of the piezoelectric layer is determined by the material used and the film thickness of the piezoelectric layer is determined by the desired resonance frequency, in actual practice the capacitance of the BAW resonator is determined by the square measure of the BAW resonator. Therefore, the square measure of the BAW resonator should be so determined as to achieve a capacitance that satisfies the requirement for impedance matching with the adjoining device. In other words, on account of the need for impedance matching, the square measure of the BAW resonator is restricted to a specific value. Namely, as long as BAW resonators are arrayed on the same plane, their downsizing has its own limit.

The technique disclosed by U.S. Pat. No. 7,038,559 B2 makes it possible to increase the packaging density in forming a plurality of BAW resonators and filters over the same substrate. However, it requires a manufacturing process using a sacrificial layer to form a hollow structure. This entails the problem of requiring difficult manufacturing techniques and accordingly an increase in cost. There is another disadvantage that, since no process to form a hollow structure is used for semiconductor device manufacturing in general, it is difficult to achieve compatibility with semiconductor processes.

Referring now to U.S. Pat. No. 5,587,620, the statement that "Electrode 26 common to both FBARs" in U.S. Pat. No. 7,019,605 B2 can be construed as meaning that the central electrode 26 is grounded. U.S. Pat. No. 7,019,605 B2, in view of the circumstance that the technique disclosed in U.S. Pat. No. 5,587,620 cited above "The single Lorentzian resonance makes it difficult or impossible to design a band-pass filter with such desirable characteristics such as broad pass band", attempts to provide the band-pass filter such desirable properties as a low insertion loss and flat frequency response in its pass band, a pass bandwidth in the range from about 3% to about 5% of the center frequency and good out-of-band rejection by the reduced acoustic coupling.

However, according to the invention disclosed in U.S. Pat. No. 7,019,605 B2, as an energy loss occurs when acoustic waves propagate in the acoustic decoupler, it is intrinsically susceptible to large insertion losses and unsuitable for the loss reducing purpose. The filter disclosed in U.S. Pat. No. 5,587,620, on the other hand, is narrow in pass band and therefore unsuitable for configuring a wide band-pass filter required for modern mobile communication systems.

The present invention is intended to address these problems with conventionally available techniques. The main problem to be addressed by the invention is to realize a reduction in element area without relying on highly difficult manufacturing techniques to produce a BAW resonator structure and radio-frequency filter subject to a low insertion loss and having a wide pass band.

A typical example of configuration of the invention will be described below. A thin film bulk acoustic wave resonator structure includes a substrate, at least one acoustic reflection layer, a plurality of thin film bulk acoustic wave resonators stacked with the acoustic reflection layer in-between and disposed over the substrate, an input terminal and an output terminal, wherein each of the thin film bulk acoustic wave resonators has a piezoelectric layer and a pair of electrodes stacked with the piezoelectric layer in-between; wherein the acoustic reflection layer is electroconductive; two of the thin film bulk acoustic wave resonators stacked with the acoustic reflection layer in-between are electrically connected via the acoustic reflection layer; and wherein at least one of the thin film bulk acoustic wave resonators is electrically connected to the input terminal and the output terminal via the acoustic reflection layer.

The BAW resonator structure and the radio-frequency filter according to the invention allow a substantial reduction in element area by arraying a plurality of BAW resonators in the height direction. Also according to the invention, it is made possible to configure a filter by electrically connecting a plurality of BAW resonators, and a radio-frequency filter subject to a low insertion loss and having a wide pass band, such as a ladder circuit, can be fabricated.

BRIEF DESCRIPTION OF THE DRAWINGS

FIG. 8 is a longitudinal section view of a BAW resonator structure, which is another preferred embodiment of the invention;

DETAILED DESCRIPTION OF THE PREFERRED EMBODIMENTS

A BAW resonator structure and radio-frequency filter according to the invention, in one example, includes a substrate, a first BAW resonator placed over the substrate, an acoustic reflection layer placed over the first BAW resonator and a second BAW resonator placed over the acoustic reflection layer, and the acoustic reflection layer is electroconductive. Here, the acoustic reflection layer constitutes a first electrode, and the first BAW resonator and the second BAW resonator are electrically connected and acoustically separated by this first electrode.

Preferred embodiments of the invention will be described in detail below with reference to the accompanying drawings.

Embodiment 1

Figure 1A:
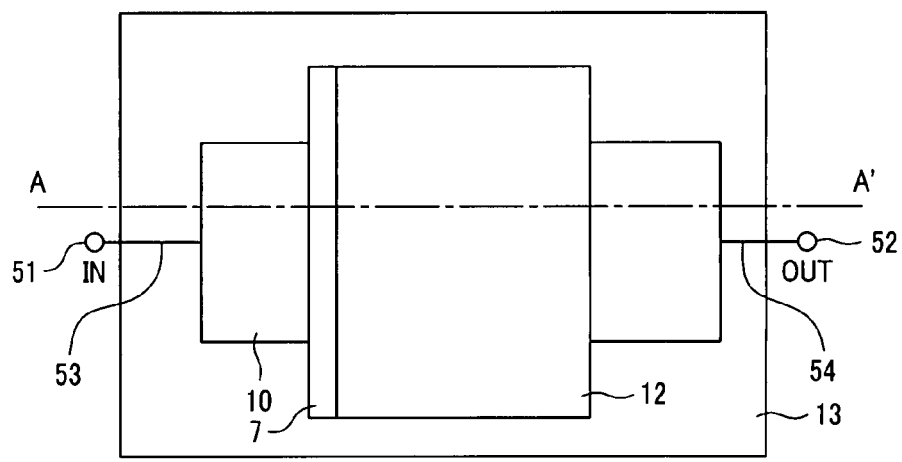
FIG. 1A is a plan view of a resonator structure using BAW resonators, which constitutes a first preferred embodiment of the present invention.
Figure 1B:
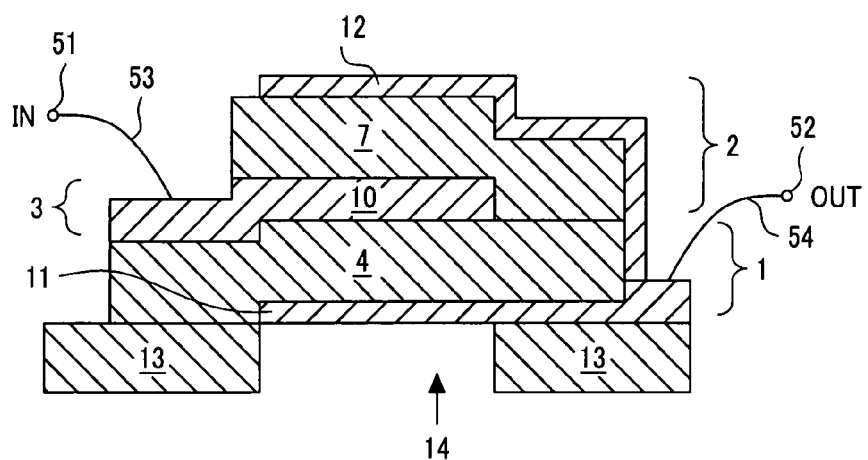
FIG. 1B is an A-A' section view of FIG. 1A.
Figure 1C:
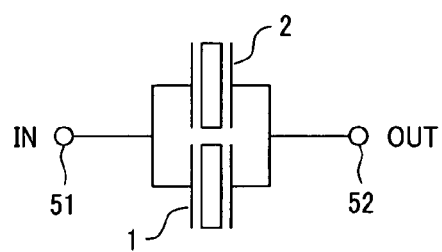
FIG. 1C shows an equivalent circuit to the first preferred embodiment.

First, a first preferred embodiment of the invention will be described with reference to FIG. 1A to FIG. 1D, FIG. 2, and FIG. 3. FIG. 1A to FIG. 1C show a BAW resonator structure, which is one embodiment of the invention, wherein FIG. 1A shows a plan view of the resonator structure; FIG. 1B, an A-A' section view of FIG. 1A; and FIG. 1C, an equivalent circuit to the structure shown in FIG. 1A and FIG. 1B.

The BAW resonator structure of this embodiment is provided with a first BAW resonator 1, an electroconductive acoustic reflection layer 3, a second BAW resonator 2 and a cavity 14 disposed in a substrate 13. The first BAW resonator 1 includes a first piezoelectric layer 4, and a first metal layer 11 and a second metal layer 10 placed underneath the lower face and over the upper face of this first piezoelectric layer 4. The second BAW resonator 2 includes a second piezoelectric layer 7, and a second metal layer 10 and a third metal layer 12 placed underneath the lower face and over the upper face of the second piezoelectric layer 7. The BAW resonator structure of this embodiment is fabricated solely by a thin film fabrication process, in which the two resonators are stacked one over the other in the height direction (the stacking direction) with the electroconductive acoustic reflection layer between them.

The second metal layer 10 constitutes a first electrode and the first metal layer 11 and the third metal layer 12 together constitute a second electrode, respectively connected to an input terminal 51 and an output terminal 52 via signal lines 53 and 54.

The second metal layer 10 which constitutes the electroconductive acoustic reflection layer is composed of at least one metal layer. Thus, the material of the electroconductive acoustic reflection layer 3 is so selected that a bulk-acoustic-wave (BAW) is reflected by the interface between the electroconductive acoustic reflection layer 3 and the first BAW resonator 1 and by the interface between the electroconductive acoustic reflection layer 3 and the second BAW resonator 2.

Generally, the acoustic impedances of a medium I and a medium II being represented by $Z_1$ and $Z_2$, respectively, the power reflectance R of BAW on the interfaces of those media can be expressed by Formula 1 below.

$$R = \left(\frac{Z_1 - Z_2}{Z_1 + Z_2}\right)^2 \quad (1)$$

For instance, R on the interface between aluminum (Al) and tungsten (W) can be calculated in the following way. The impedances of Al and W to a longitudinal wave are respectively about $16.98 \times 10^6$ and about $100.41 \times 10^6$ (in Pa·s/m). Therefore, when a BAW comes incident from Al on the interface of W, R is about 0.5051.

For the BAW resonator structure and filter according to the invention, it is preferable to so select the materials for the acoustic reflection layer 3, the first piezoelectric layer 4 and the second piezoelectric layer 7 as to make R at least 0.100 or more than it.

While a material whose main component is aluminum nitride (AlN), zinc oxide (ZnO) or tantalum oxide ($Ta_2O_5$) is preferable for the first piezoelectric layer 4 and the second piezoelectric layer 7, some other suitable material can also be used. For the metal layers, a material whose main component contains at least one of W, molybdenum (Mo), Al and titanium (Ti) is used, but some other metallic material can also be used.

Table 1 shows the relationships among combinations of materials constituting the electroconductive acoustic reflection layer 3, the number of constituent layers and each of reflectance R (R1, R5 and R7).

TABLE 1

Materials and reflectance R of the electroconductive acoustic reflection layer

| Material | Reflectance R1 (1-layered) | Reflectance R5 (5-layered) | Reflectance R7 (7-layered) |
| --- | --- | --- | --- |
| Al/W | 0.5051 | 0.9703 | 0.9927 |
| Al/Pt | 0.4502 | 0.9488 | 0.9848 |
| Ti/W | 0.3093 | 0.8428 | 0.9250 |

In this embodiment, the second metal layer 10 which constitutes the electroconductive acoustic reflection layer electrically connects and acoustically separates the first BAW resonator 1 and the second BAW resonator 2. Thus, the second metal layer 10 can be regarded as an electric line which links the first BAW resonator 1 and the second BAW resonator 2.

In the BAW resonator structure of this embodiment, the resonance frequency f1 of the first resonator 1 obtained by the excitation of the first piezoelectric layer 4 and the resonance frequency f2 of the second resonator 2 obtained by the excitation of the second piezoelectric layer 7 are set to be substantially the same. For instance, the first piezoelectric layer 4 is AlN whose film thickness is 1338 nm, the second piezoelectric layer 7 is AlN whose film thickness is 1338 nm, the first metal layer 11 is W whose film thickness is 167 nm, the second metal layer 12 is W whose film thickness is 167 nm, and the third metal layer 10 is W whose film thickness is 334 nm.

In this embodiment, the two thin film bulk acoustic wave resonators 1 and 2 are connected electrically in parallel to the input terminal 51 and the output terminal 52 via the acoustic reflection layer 3. For this reason, the resonators shown in FIG. 1A and FIG. 1B can be regarded as shown in FIG. 1C equivalently. Thus, between the first terminal 51 and the second terminal 52, the first resonator 1 of the resonance frequency f1 and the second resonator 2 of the resonance frequency f2 are connected in parallel.

In this case, both f1 and f2 are about 1.9 GHz. Since f1 and f2 are the same in the example of FIG. 1, characteristically the first metal layer 11 and the second metal layer 12 can be connected to the same signal line 54 as shown in FIG. 1B.

The impedance Z of the radio-frequency resonator structure of this embodiment, as it has the resonators 1 and 2 connected in parallel, is ½ of a structure with only one resonator. Thus, the BAW resonator structure of FIG. 1A and FIG. 1B, with the impedance of the resonators 1 and 2 being supposed to be Z0, has an impedance $Z0 = 1/j\omega C$, and their parallel connection results in $Z = \frac{1}{2} \cdot (1/j\omega C)$. In other words, the resonator structure of this embodiment can achieve a performance equal to the conventional one with only half as large a square measure. For instance, where the planar shape of the BAW resonator structure is square, the length of one side, which is 100 μm in the conventional one, would be $100/\sqrt{2} \approx 70.7$ μm to achieve a performance equal to the conventional one.

Furthermore, as the third metal layer 10 connects the first BAW resonator 1 and the second BAW resonator 2 by surface, the energy loss attributable to the electrical resistance on the line is infinitesimal with the result of enhancing the Q values of the BAW resonator structure and filter.

Further, the arraying of BAW resonators in the height direction can serve to reduce the element area of the direction of a plane substantially. Thus, while two BAW resonators are arrayed on a plane in the conventional filter configuration of parallel connection, the first BAW resonator 1 and the second BAW resonator 2 are stacked in the height direction in the filter according to the invention, and accordingly the element area can be reduced substantially. Moreover, there is no need to connect the first BAW resonator 1 and the second BAW resonator 2 with a lead wire, and their surface contact makes the electrical loss infinitesimal.

Figure 1D:
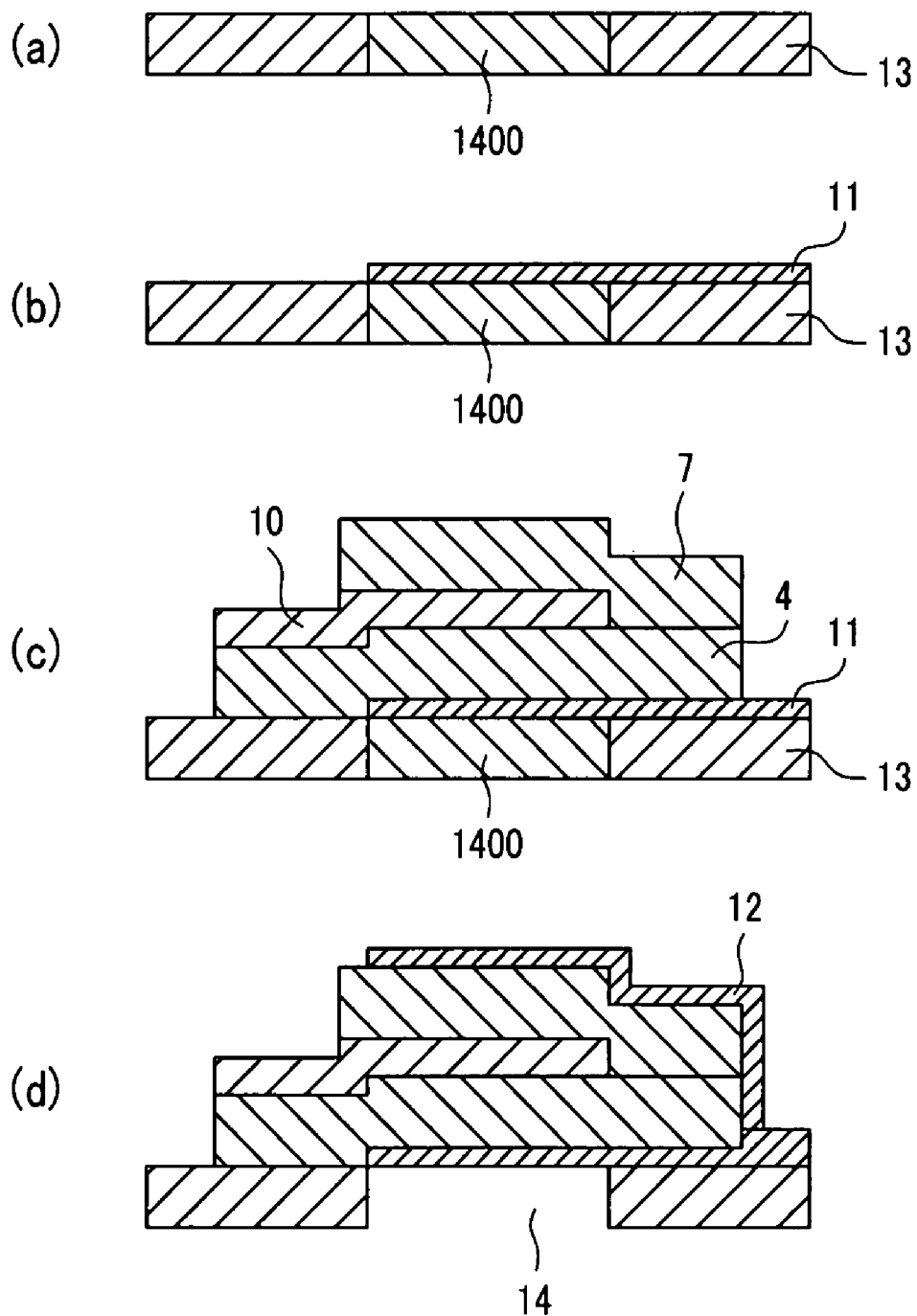
FIG. 1D(a) to FIG. 1D(d) illustrate outlines of the process of producing the BAW resonators which constitute the first embodiment.

The BAW resonator structure and filter of this embodiment can be fabricated by a usual thin film fabrication process in semiconductor manufacturing technology. FIG. 1D(a) to FIG. 1D(d) illustrate outlines of the process of producing the BAW resonators. First, a void section matching the cavity 14 is formed in an insulated substrate or a high-resistance silicon substrate 13 by the usual photoresist or etching process.

Then, a sacrificial layer 1400 is stacked over the surface of the substrate 13 by using a deposition equipment. Next, the surface of the substrate 13 is planarized, and a state in which only the cavity 14 is filled with the sacrificial layer 1400 is achieved (FIG. 1D(a)). Then, first the first metal layer 11 is stacked by film formation over the substrate 13 whose surface has been planarized, followed by patterning by a photoresist process and an etching process to obtain the first metal layer 11 (FIG. 1D(b)). Thereafter, other layers are formed while being stacked successively (FIG. 1D(c)). Next, the third metal layer 12 is formed over it by film formation and patterning, and wiring including signal lines is formed by Al film and so forth. Finally, the sacrificial layer 1400 is removed with a solution to form the cavity 14 (FIG. 1D(d)).

Although the planar shape of the BAW resonator structure is shown to be square in FIG. 1A, the shape is not actually limited to this, but any other appropriate shape can be chosen according to the requirements of different designs. The same is true of the sectional shape of the BAW resonator structure. These statements apply to all the embodiments to be described hereinafter.

Hereupon, the BAW resonators constituting the resonator structure of this embodiment will be described by way of a typical example.

Figure 2:
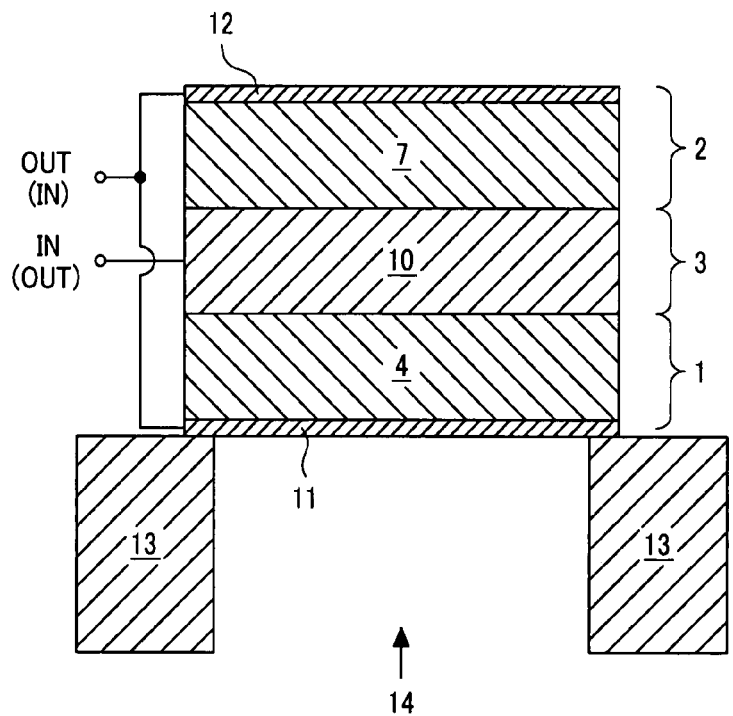
FIG. 2 is a longitudinal section view of a BAW resonator structure, which is another preferred embodiment of the invention.

FIG. 2 shows a sectional view of one example of BAW resonator applicable to the resonator structure of this embodiment. This BAW resonator comprises the first piezoelectric layer 4, the second piezoelectric layer 7, the first electrode 10 containing the electroconductive acoustic reflection layer, the second electrode 11, the third electrode 12, the substrate 13 and the cavity 14 disposed in the substrate 13.

While it is preferable to use a material whose main component is aluminum nitride (AlN), zinc oxide (ZnO) or tantalum oxide ($Ta_2O_5$) for the first piezoelectric layer 4 and the second piezoelectric layer 7, some other piezoelectric material can as well be used. For the first metal layer 10, the second metal layer 11 and the third metal layer 12, a material whose main component is W, molybdenum (Mo), Al or titanium (Ti) is used, but some other metallic material can also be used.

In this embodiment, the first electrode 10 constituting the acoustic reflection layer is connected to either the input terminal 51 or the output terminal 52, and the second electrode 11 and the third electrode 12 are connected to the other input terminal or output terminal. The two thin film bulk acoustic wave resonators 1 and 2 are connected electrically to the input terminal 51 and the output terminal 52 via the acoustic reflection layer 3.

Generally, a BAW structure and filter requires a structure to prevent acoustic energy from leaking to the substrate. In this embodiment, the cavity 14 is utilized for preventing acoustic energy from leaking to the substrate. It is desirable for the cavity 14 to extend over the most or whole part of the bottom face of the area in which the first electrode 10 and the second electrode 11 overlap each other.

Figure 3:
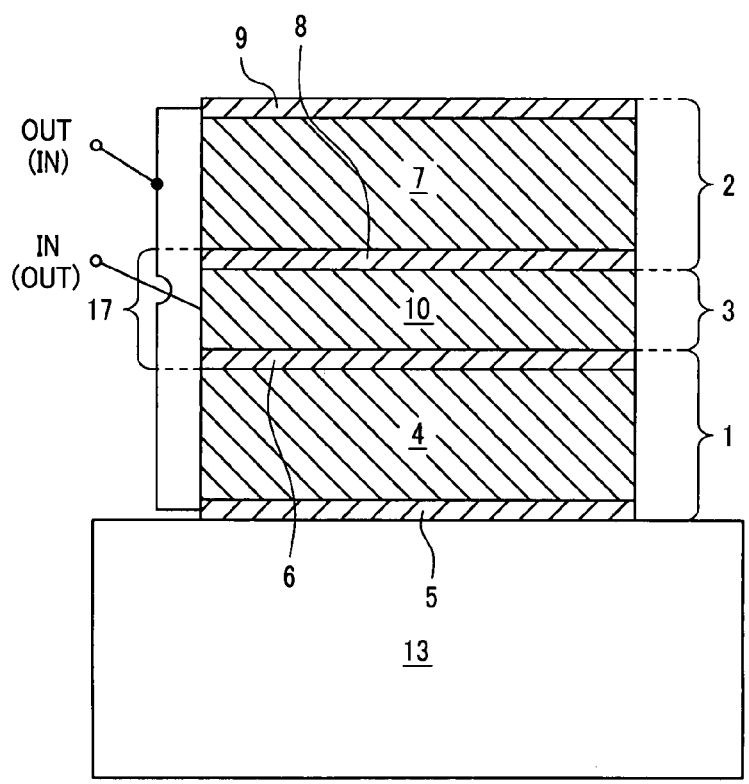
FIG. 3 is a longitudinal section view of a BAW resonator structure, which is still another preferred embodiment of the invention.

Next, FIG. 3 shows a section of a BAW resonator structure, which is still another example of configuration applicable to the filter of this embodiment. This BAW resonator structure is provided with the substrate 13, the first BAW resonator 1, the electroconductive acoustic reflection layer 3 and the second BAW resonator 2. The first BAW resonator 1 includes the first piezoelectric layer 4, the first metal layer 5 and the second metal layer 6 respectively placed underneath the lower face and over the upper face of the first piezoelectric layer 4. The second BAW resonator 2 includes the second piezoelectric layer 7, a third metal layer 8 and the fourth metal layer 9 respectively placed underneath the lower face and over the upper face of second piezoelectric layer 7. A stacked conductor 17 composed of the electroconductive acoustic reflection layer 3, the second metal layer 6 and the third metal layer 8 constitutes the first electrode 10, the first metal layer 5 constitutes the second electrode 11, and the fourth metal layer 9 constitutes the third electrode 12.

In this embodiment, the first electrode 10 constituting the acoustic reflection layer is connected to either the input terminal 51 or the output terminal 52, and the second electrode 11 and the third electrode 12 are connected to the other terminal. The two thin film bulk acoustic wave resonators 1 and 2 are connected electrically to the input terminal 51 and the output terminal 52 via the acoustic reflection layer 3.

The third metal layer 10 constituting the electroconductive acoustic reflection layer is composed of at least one metal layer. Thus, the material of the electroconductive acoustic reflection layer 3 is so selected as to have a BAW reflected by the interface between the electroconductive acoustic reflection layer 3 and the first BAW resonator 1 and by the interface between the electroconductive acoustic reflection layer 3 and the second BAW resonator 2. More specifically, a material having an acoustic impedance greatly differing from the acoustic impedances of the second metal layer 6 and of the third metal layer 8 is selected to configure the electroconductive acoustic reflection layer 3.

For the BAW resonator structure and filter according to the invention, it is preferable to so select the materials for the acoustic reflection layer 3, the second metal layer 6, the third metal layer 8, the first piezoelectric layer 4 and the second piezoelectric layer 7 as to make the reflectance R at least 0.100.

While a material whose main component is aluminum nitride (AlN), zinc oxide (ZnO) or tantalum oxide ($Ta_2O_5$) is preferable for the first piezoelectric layer 4 and the second piezoelectric layer 7, some other suitable material can also be used. For the first metal layer 5, the second metal layer 6, the third metal layer 8 and the fourth metal layer 9, a material whose main component is W, molybdenum (Mo), Al or titanium (Ti) is used, but some other metallic material can also be used.

The electroconductive acoustic reflection layer 3 electrically connects and acoustically separates the first BAW resonator 1 and the second BAW resonator 2. Thus, the stacked conductor 17 can be regarded as an electric line which links the first BAW resonator 1 and the second BAW resonator 2. As the stacked conductor 17 connects the first BAW resonator 1 and the second BAW resonator 2 by surface, the energy loss attributable to the electrical resistance on the line is infinitesimal with the result of enhancing the Q values of the BAW resonator structure and filter.

Figure 4A:
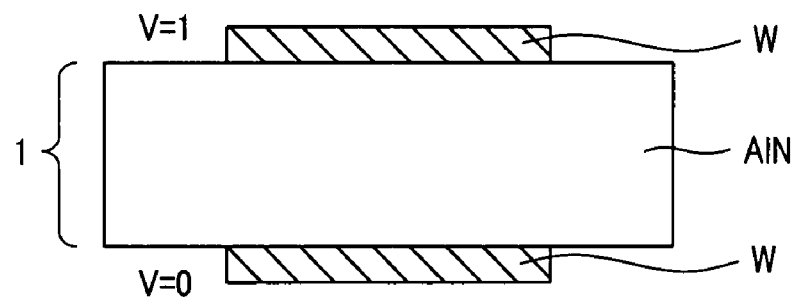
FIG. 4A schematically shows a model of a BAW resonator, which is a comparative example, used in simulation by the finite element method.
Figure 4B:
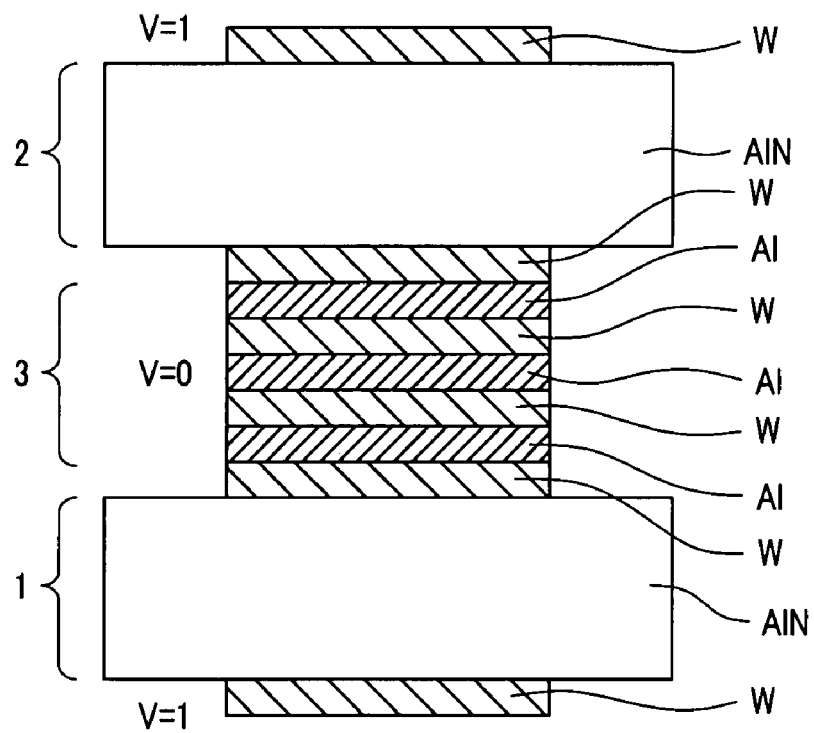
FIG. 4B schematically shows a model of the BAW resonator structure according to the invention, used in simulation by the finite element method.

Next, in order to evaluate the performance of Embodiment 1, in other words the BAW resonator structure according to the invention, simulation was carried out by the finite element method. FIG. 4A schematically shows a model of a conventional BAW resonator, and FIG. 4B, a model of the BAW resonator structure according to the invention, both used in simulation by the finite element method. The simulation was conducted two-dimensionally. Incidentally in the schematic diagrams of FIG. 4A and FIG. 4B, the aspect ratio does not reflect that of the actual models.

Figure 5A:
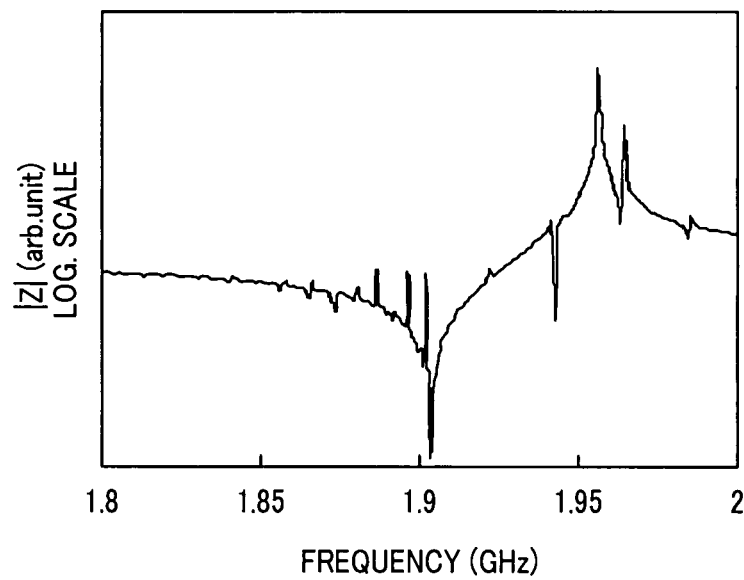
FIG. 5A shows the impedance characteristic of the BAW resonator of FIG. 4A, estimated by simulation by the finite element method.
Figure 5B:
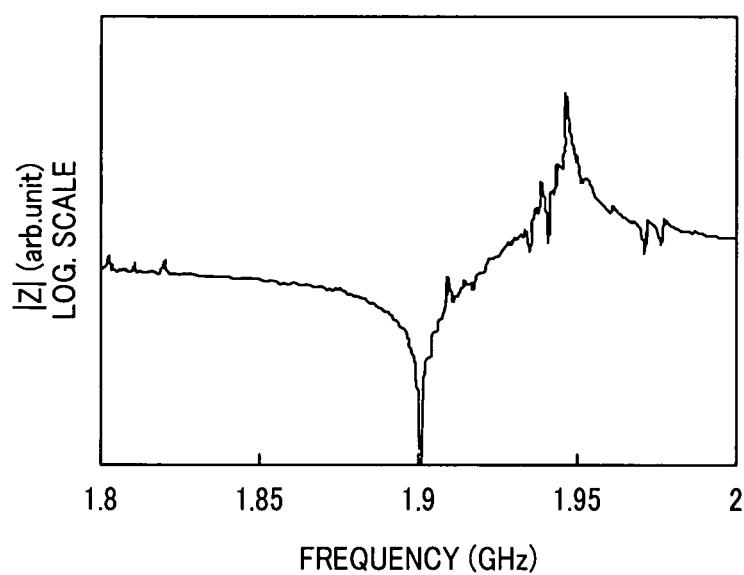
FIG. 5B shows the impedance characteristic of the BAW resonator of FIG. 4B, estimated by simulation by the finite element method.

FIG. 5A and FIG. 5B show the impedance characteristics estimated by simulation by the finite element method. FIG. 5A shows the result of simulation of the conventional BAW resonator presented for the sake of comparison, corresponding to the comparative model of FIG. 4A. FIG. 5B shows the result of simulation of the BAW resonator structure according to the invention, corresponding to the model of the invention shown in FIG. 4B. In both FIG. 5A and FIG. 5B, the resonance frequency was found in the vicinity of 1.9 GHz. To take note of the vicinity of 1.85 to 1.9 GHz, which is the lower side of the resonance frequency range, while ripples presumably attributable to the spurious mode usual for BAW resonators are witnessed in FIG. 5A, no ripple is found in FIG. 5B.

These findings suggest that the spurious mode is restrained from occurring in the low resonance frequency range in the BAW resonator structure and filter according to the invention.

Figure 5C:
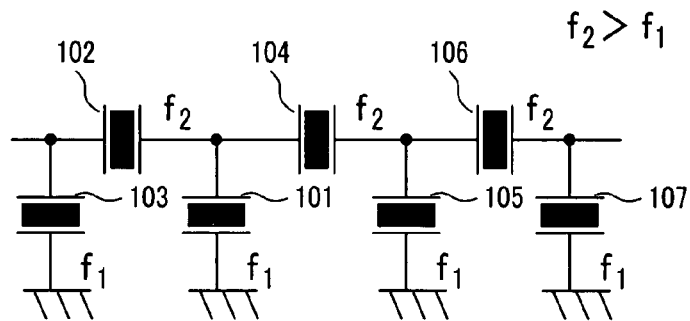
FIG. 5C shows an example of usual BAW filter circuit configuration having series resonators and shunt resonators.
Figure 5D:
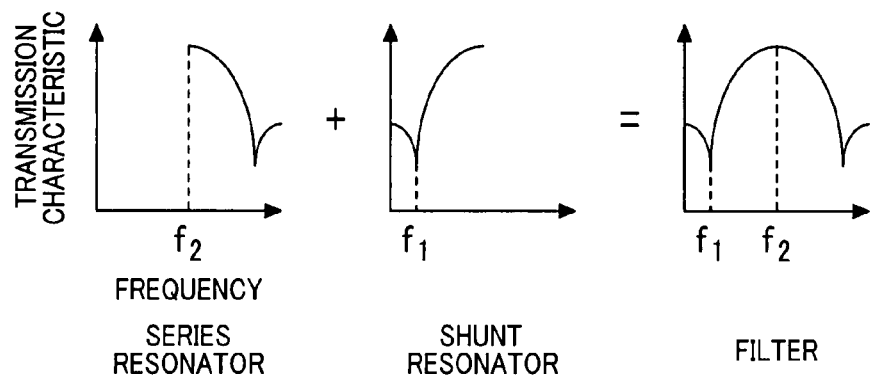
FIG. 5D illustrates the filtering characteristics of the BAW filter shown in FIG. 5C.

A BAW filter is generally realized by configuring a ladder circuit comprising a plurality of BAW resonators (shunt resonators 101, 103, 105 and 107 and series resonators 102, 104 and 106) as shown in FIG. 5C. The filter characteristic in this case is the synthesis of the characteristic of the series resonators (resonance frequency f2) and that of the shunt resonators (resonance frequency f1) as shown in FIG. 5D. For the BAW resonators used in the series of the ladder circuit, the lower side of resonance frequency corresponds to the pass band of the filter, and therefore the capability of restraining ripples on the lower side of resonance frequency as shown in FIG. 5B is an advantage directly contributing to enhancing the performance of the BAW filter.

The BAW resonator structure and filter of this embodiment have the advantages of a low insertion loss and a wide pass band. Also, as they can be fabricated by a usual thin film fabrication process in semiconductor manufacturing technology, they can be more easily manufactured at lower cost than conventional such products. Moreover, by arraying BAW resonators in the height direction, the element area can be substantially reduced.

Embodiment 2

Figure 6A:
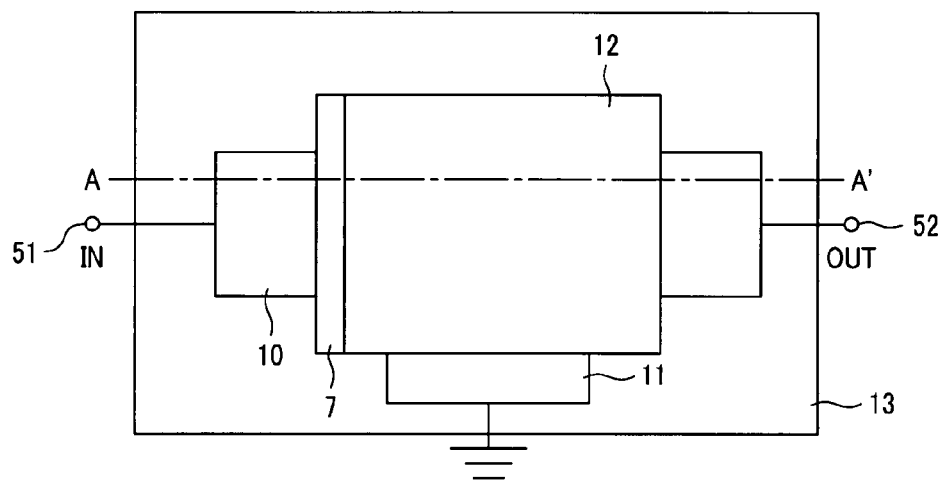
FIG. 6A is a plan view of a filter using BAW resonators, which is a preferred embodiment of the invention.
Figure 6B:
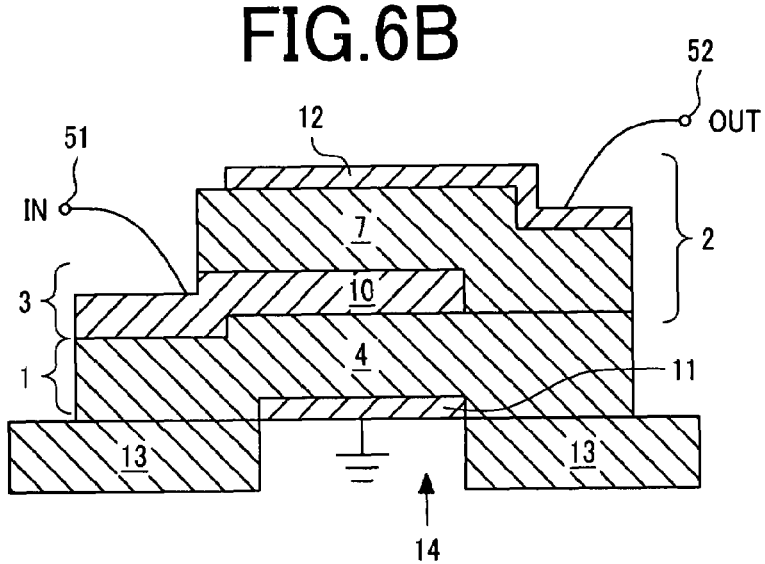
FIG. 6B is an A-A' section view of FIG. 6A.

Next, a radio-frequency filter which has a BAW resonator which is a second preferred embodiment of the invention will be described with reference to FIG. 6A to FIG. 6C, wherein FIG. 6A shows a plan view of the filter; FIG. 6B an A-A' section of FIG. 6A; and FIG. 6C, an equivalent circuit to the filter having the configuration of this embodiment.

The BAW resonator of this embodiment is provided with the first piezoelectric layer 4, the second piezoelectric layer 7, the first electrode 10 including the electroconductive acoustic reflection layer and connected to the input terminal 51, the second electrode 11, the third electrode 12, the substrate 13 and the cavity 14. It is desirable for the cavity 14 to extend over the most or whole part of the bottom face of the area in which the first electrode 10 and the second electrode 11 overlap each other. The differences from Embodiment 1 include the difference in film thickness between the first piezoelectric layer 4 and the second piezoelectric layer 7 and the connection of the second electrode 11 to the ground with only the third electrode 12 being connected to the output terminal 52. As the materials of the constituent members are the same as their respective counterparts in Embodiment 1, their description will be dispensed with.

In this embodiment, the resonance frequency f1 obtained by the excitation of the first resonator 1 (the first piezoelectric layer 4 in FIG. 6B) and the resonance frequency f2 obtained by the excitation of the second resonator 2 (the second piezoelectric layer 7 in FIG. 6B) are set to be substantially different values.

In one example, the first piezoelectric layer 4 is AlN and its film thickness is 1373 nm, the second piezoelectric layer is AlN and its film thickness is 1338 nm, the first electrode 10 has a stacked structure of W/Al/W/Al/W/Al/W/ from top to bottom and their film thicknesses are 167 nm/843 nm/686 nm/843 nm/686 nm/843 nm/171 nm, the second electrode 11 is W and its film thickness is 171 nm, and the third electrode 12 is W and its film thickness is 167 nm. In this example, f1 and f2 are respectively about 1.85 GHz and about 1.9 GHz.

Figure 6C:
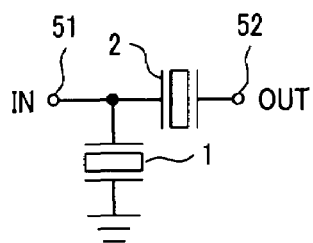
FIG. 6C shows an equivalent circuit to the embodiment shown in FIG. 6A.

In the example shown in FIG. 6A to FIG. 6C, as the resonance frequencies f1 and f2 of the two resonators are different from each other, by connecting the first electrode 10 to the input terminal, the second electrode 11 to the ground terminal and the third electrode 12 to the output terminal, a filter formed of a single-stage ladder circuit is realized.

Thus, in the filter of the configuration of this embodiment, one thin film bulk acoustic wave resonator 2 is electrically connected to the input terminal 51 and the output terminal 52 via the acoustic reflection layer 3 and the electrode 11 opposite the acoustic reflection layer 3 of the other thin film bulk acoustic wave resonator 1 is grounded. Therefore, it can be equivalently regarded as shown in FIG. 6C. Between the first terminal 51 and the second terminal 52, the first resonator 1 of the resonance frequency f1 and the second resonator 2 of the resonance frequency f2 are connected in a ladder form.

Where a Bragg reflection layer as the acoustic reflection layer included in the first electrode 10 is utilized as in the example of FIG. 6A to FIG. 6C, the reflectance of the acoustic reflection layer takes on a frequency characteristic, and the film thickness of the Bragg reflection layer should be optimized to maximize the reflectance at the points of f1 and f2. Where f1 and f2 are different, the design of the film thickness of the Bragg reflection layer is made more complex. However, the Bragg reflection layer is known to have a sufficient reflectance in a relatively wide range around ¼ frequencies of the film thicknesses of the constituent layers. Therefore, fabrication of a filter whose bandwidth is about 3% by using the structure of the invention poses no particular problem.

Figure 7A:
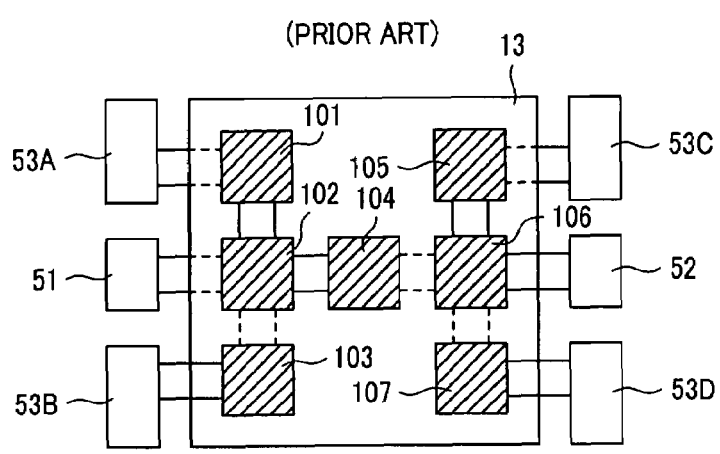
FIG. 7A shows a conventional type ladder filter circuit configured of seven BAW resonators shown in FIG. 5C.
Figure 7B:
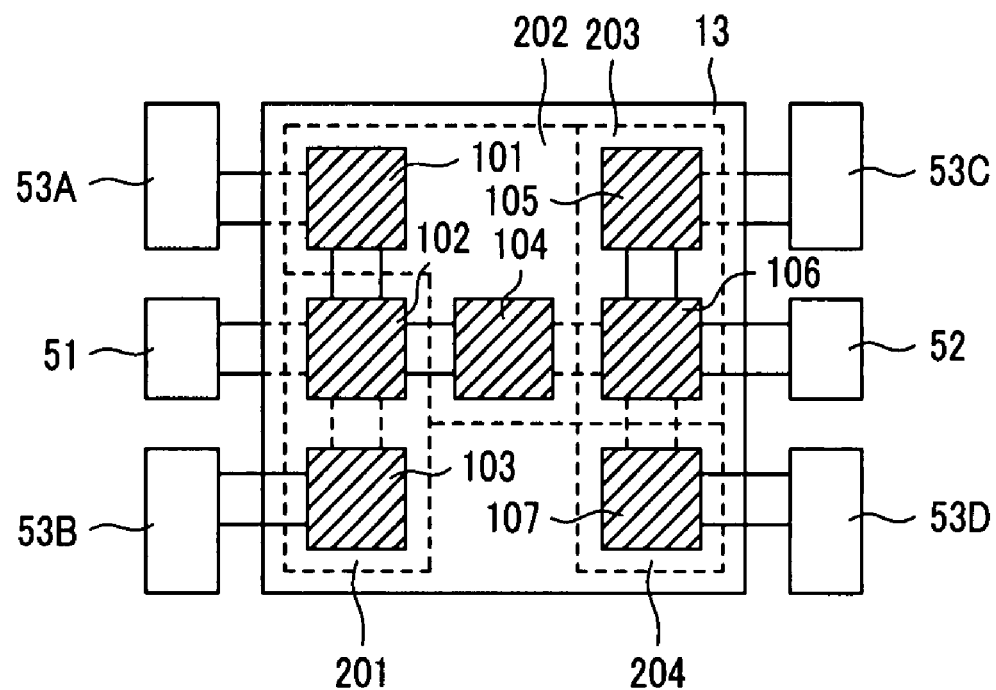
FIG. 7B illustrates an example of configuration of the ladder filter circuit of FIG. 7A to be implemented according to the invention.
Figure 7C:
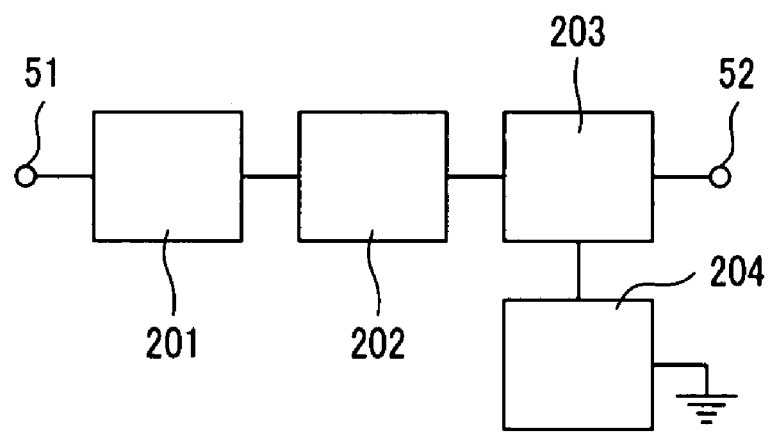
FIG. 7C illustrates an example of arrangement of BAW resonators where 7B illustrates an example of configuration of the ladder filter circuit of FIG. 7A is implemented according to the invention.

The BAW resonator structure and filter of this embodiment enable the element area of the direction of a plane to be substantially reduced. This aspect of element area reduction will now be described with reference to FIG. 7. FIG. 7A shows a plan view of a conventional type ladder filter circuit configured of seven BAW resonators (101 through 107) shown in FIG. 5C. According to the invention, according to which the ladder-shaped filter circuit includes two BAW resonators stacked one over the other as shown in the illustration of the second embodiment, the seven BAW resonators (101 through 107) of FIG. 7A can be reduced to three sets of two-stage BAW resonators (201 through 203) and one BAW resonator as shown in FIG. 7B. As a result, the ladder-shaped filter circuit configured of BAW resonators (101 through 107) can be realized with a substantially reduced element area as shown in FIG. 7C.

Thus, the BAW resonator structure and filter according to the invention have the advantages of a low insertion loss and a wide pass band. Also, as they can be fabricated by a usual thin film fabrication process in semiconductor manufacturing technology, they can be more easily manufactured at lower cost than conventional such products. Moreover, they not only have the advantages over conventional technology that they are easier to manufacture at lower cost and enable the element area can be substantially reduced but also are advantageous in the enhancement of filter performance.

Further, the arraying of BAW resonators in the height direction contributes to a substantial reduction in the element area.

Embodiment 3

FIG. 8 shows a section view of a BAW resonator structure, which is another preferred embodiment applicable to the resonator structure and filter described with reference to the first and second embodiments of the invention and other BAW resonator structures embodying the invention in other ways to be described afterwards. This BAW resonator structure is provided with the substrate 13, the first BAW resonator 1, the electroconductive acoustic reflection layer 3 and the second BAW resonator 2, wherein the first BAW resonator 1 includes the first piezoelectric layer 4 and a first metal layer 19 placed underneath the lower face of the first piezoelectric layer 4, and the second BAW resonator 2 includes the second piezoelectric layer 7 and a fourth metal layer 20 placed over the upper face of the second piezoelectric layer 7. The electroconductive acoustic reflection layer 3 constitutes the first electrode, the first metal layer 19 constitutes the second electrode, and the fourth metal layer 20 constitutes the third electrode. The first electrode 10 is connected to either the input terminal 51 or the output terminal 52. The second electrode 19 and the third electrode 20 are connected to either the input terminal 51 or the output terminal 52 or grounded (connected to the grounding wire).

While a material whose main component is aluminum nitride (AlN), zinc oxide (ZnO) or tantalum oxide (Ta$_2$O$_5$) is preferable for the first piezoelectric layer 4 and the second piezoelectric layer 7, some other suitable material can also be used. For the first metal layer 19 and the second metal layer 20, a material whose main component is W, molybdenum (Mo), Al or titanium (Ti) is used, but some other metallic material can also be used.

In this embodiment, the electroconductive acoustic reflection layer 3 (the first electrode 10) also serves as the electrode over the upper face of the first BAW resonator 1 and the electrode placed underneath the lower face of the second BAW resonator 2. The concurrent functioning of the electroconductive acoustic reflection layer 3 as electrodes enables a decrease in the number of layers of the BAW resonator structure and filter, which is an advantage in saving the cost of the fabrication process.

The electroconductive acoustic reflection layer 3 is formed of at least one metal layer. The material of the electroconductive acoustic reflection layer 3 is so selected as to have a BAW reflected by the interface between the electroconductive acoustic reflection layer 3 and the first BAW resonator 1 and that between the electroconductive acoustic reflection layer 3 and the second BAW resonator 2. More specifically, a material having an acoustic impedance greatly differing from the acoustic impedances of the first piezoelectric layer 4 and the second piezoelectric layer 7 is selected to configure the electroconductive acoustic reflection layer 3. For the BAW resonator structure and filter according to the invention, it is preferable to so select the materials as to make the reflectance R at least 0.100 or more than it.

Figure 9:
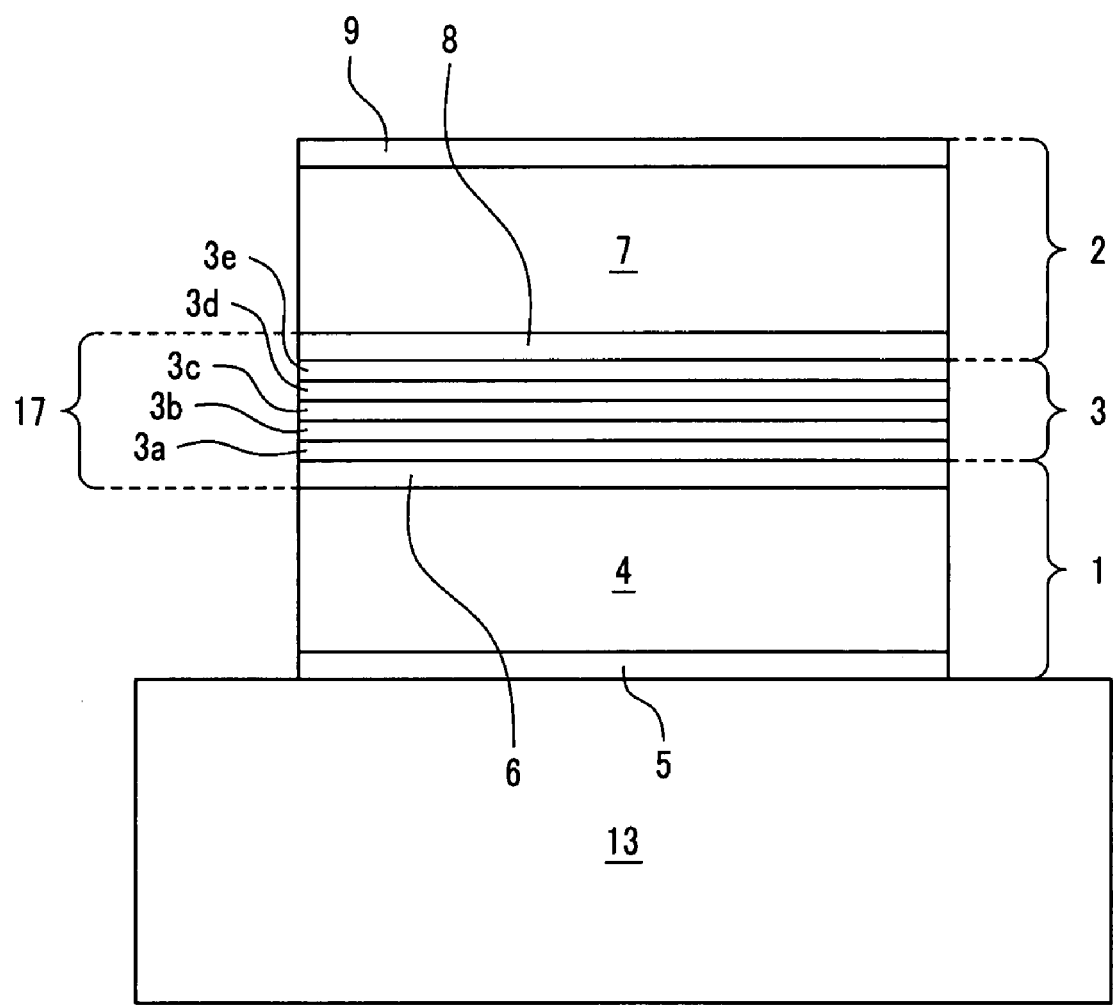
FIG. 9 is a longitudinal section view of a BAW resonator structure, which is still another preferred embodiment of the invention.

FIG. 9 shows a section view of a BAW resonator structure, which is another preferred embodiment applicable to the resonator structure and filter described with reference to the first and second embodiments of the invention and other BAW resonator structures embodying the invention in other ways to be described afterwards. This BAW resonator structure is an example of application of a Bragg reflection layer as the electroconductive acoustic reflection layer 3. In the example of FIG. 9, the electroconductive acoustic reflection layer 3 is configured of a first layer 3a, a second layer 3b, a third layer 3c, a fourth layer 3d and a fifth layer 3e. The layers 3a through 3e are formed metallic materials, metallic materials having two different acoustic impedance being alternately stacked one over the other. To cite an appropriate, more specific example, the first layer 3a, the third layer 3c and the fifth third 3e are formed of Al, and the second layer 3b and the fourth layer 3d are formed of W. It is preferable for the film thickness of the electroconductive acoustic reflection layers 3a through 3e to be set to a quarter of the wavelengths of the resonance frequency of the first BAW resonator 1 or the resonance frequency of the second BAW resonator 2. As stated above, the greater the difference in acoustic impedance between adjoining layers, the higher the reflectance of BAW. Further, as every film thickness of the layers 3a, 3b, 3c, 3d, and 3e is equal to the ¼ wavelength of BAW, BAWs reflected by each interface of the layers strengthen one another and are returned to the first BAW resonator 1 and the second BAW resonator 2. Therefore, by using a Bragg reflection layer as the electroconductive acoustic reflection layer 3, the acoustic separation between the first BAW resonator 1 and the second BAW resonator 2 can be accomplished more effectively.

Incidentally, though the Bragg reflection layer shown in FIG. 9 includes five layers, the optimal number of layers differs with the required reflectance, the material constant of each layer and other factors. The number of material types constituting one Bragg reflection layer is not limited to two, but may be three or more. Other available materials of high acoustic impedance than the aforementioned W include Mo, gold (Au), iridium (Ir), platinum (Pt), ruthenium (Ru), tantalum (Ta) and cobalt (Co) among others. Other available materials of low acoustic impedance than the aforementioned Al include indium (In), magnesium (Mg) and Ti among others.

Apart from the configurations described above, acoustic energy can be prevented from leaking to the substrate by inserting the acoustic reflection layer between the substrate and the BAW resonator.

Figure 10:
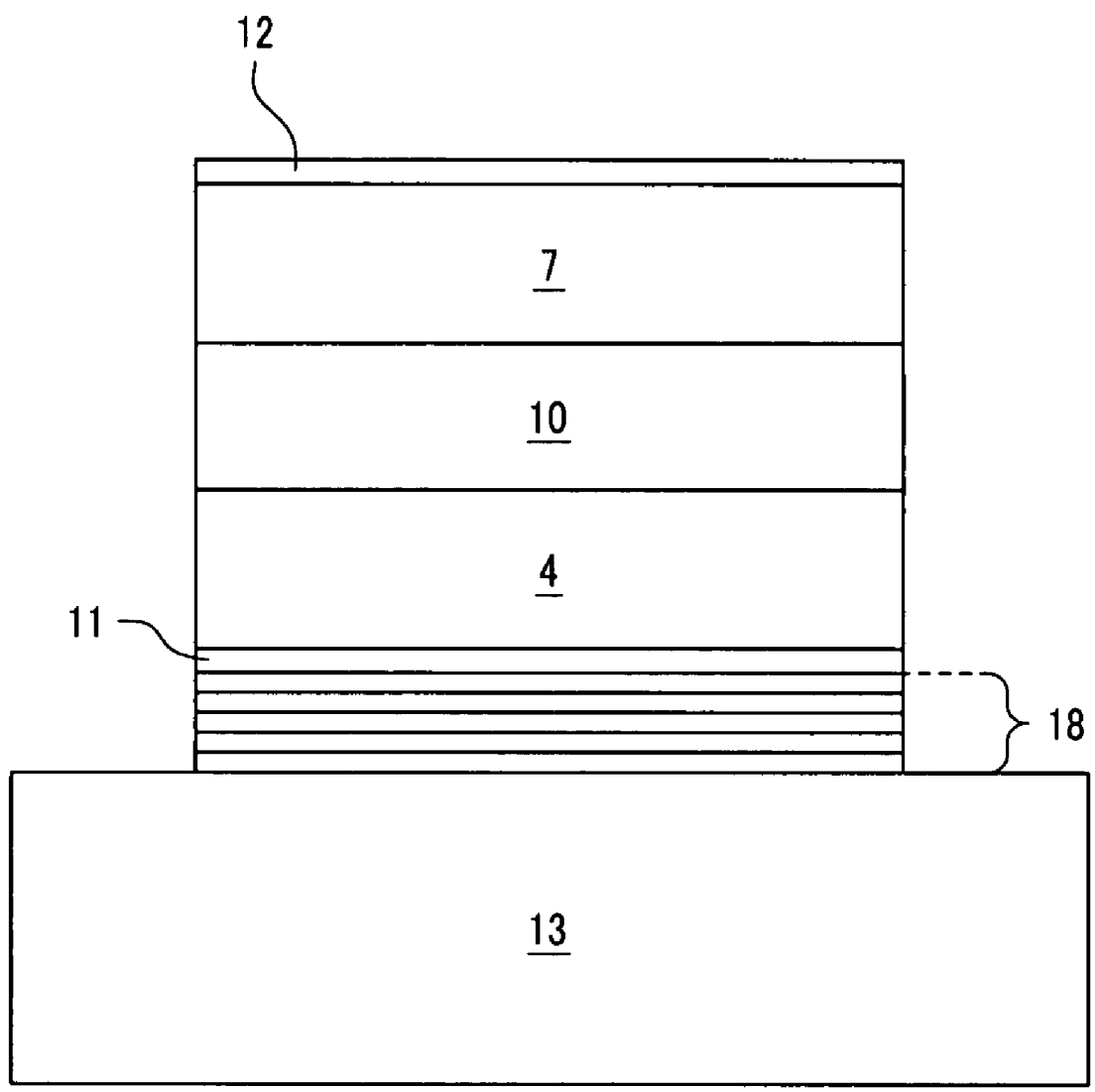
FIG. 10 is a longitudinal section view of a BAW resonator structure, which is yet another preferred embodiment of the invention.

FIG. 10 shows a section view of another BAW resonator structure applicable to a BAW resonator structure and filter, which embodies the invention. This BAW resonator structure uses a Bragg reflection layer as the acoustic reflection layer to prevent acoustic energy from leaking to the substrate. The structure shown in FIG. 10 is provided with the first piezoelectric layer 4, the second piezoelectric layer 7, the first electrode 10 including the electroconductive acoustic reflection layer, the second electrode 11, the third electrode 12, the substrate 13 and a Bragg reflection layer 18 positioned between the substrate 13 and the second electrode 11.

As the Bragg reflection prevents acoustic energy from leaking to the substrate, this structure suppresses energy loss, and eventually contributes to enhancing the Q values of the BAW resonator structure and filter.

Embodiment 4

Figure 11A:
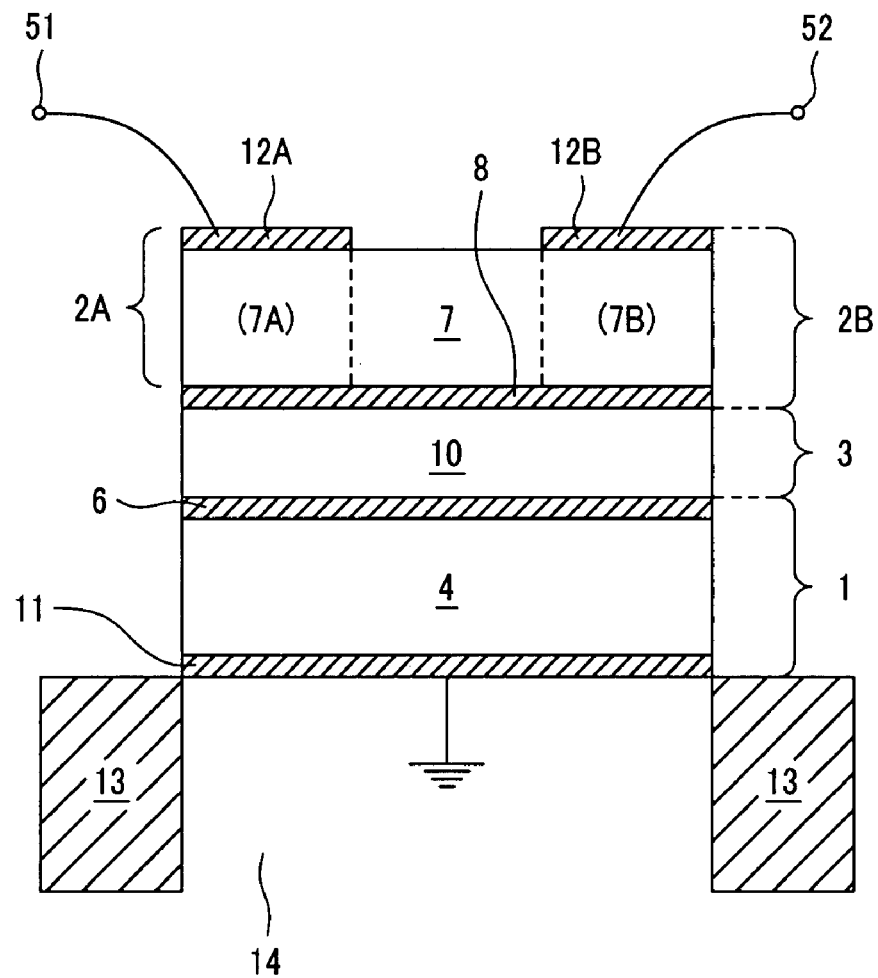
FIG. 11A is a longitudinal section view of a BAW filter, which is another preferred embodiment of the invention.

FIG. 11A shows a filter having a BAW resonator structure, which is another embodiment of the invention. Unlike the filter having the BAW resonator structure of the second embodiment, the third electrode 12 positioned over the upper face of the second piezoelectric layer 7 is split into two (electrodes 12A and 12B) in a plane at a right angle to the stacking direction and there is a gap between the two electrodes in the planar direction. The electrode 12A is connected to the input terminal, the second electrode 11 is connected to the ground terminal, and the electrode 12B is connected to the output terminal. The second piezoelectric layer 7 functions as a resonator substantially only in the areas (7A) and (7B) where the electrodes 12A and 12B are present. In this embodiment, for instance, the first piezoelectric layer 4 is formed of AlN with a film thickness of 1373 nm, the second piezoelectric layer 7 is of AlN with a film thickness of 1338 nm, the first electrode 10 is a stacked structure of W/Al/W/Al/W/Al/W/ from top to boom with film thicknesses of 167 nm/843 nm/686 nm/843 nm/686 nm/843 nm/171 nm, the second electrode 11 is of W with a film thickness of 171 nm, and the third electrodes 12 (12A and 12B) is of W with a film thickness of 167 nm. For example, where the planar shape of the BAW resonator structure is square, there may be a gap of 10 μm or more than it between the two electrodes.

Figure 11B:
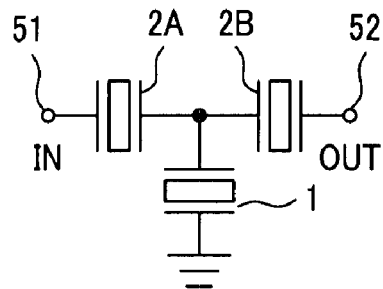
FIG. 11B shows an equivalent circuit to the embodiment shown in FIG. 11A.

Since the resonance frequency f1 of the resonator 1 matching the first piezoelectric layer 4 and the resonance frequency f2 of the resonators (2A and 2B) matching the second piezoelectric layer 7 differ from each other in this embodiment, the filter of the configuration of this embodiment can be regarded as shown in FIG. 11B. Three resonators (1, 2A and 2B) are connected in a T shape between the first terminal 51 and the second terminal 52.

As the BAW resonator structure and filter of this embodiment can be fabricated by a usual thin film fabrication process in semiconductor manufacturing technology, they can be more easily manufactured at lower cost than conventional such products. Moreover, by arraying BAW resonators in the height direction, the element area can be substantially reduced.

Embodiment 5

Figure 12A:
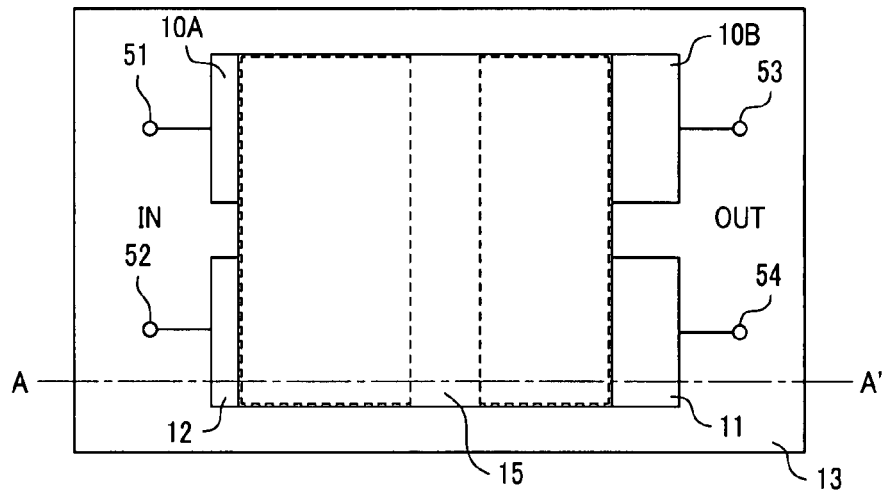
FIG. 12A is a plan view of a BAW filter, which is another preferred embodiment of the invention.
Figure 12B:
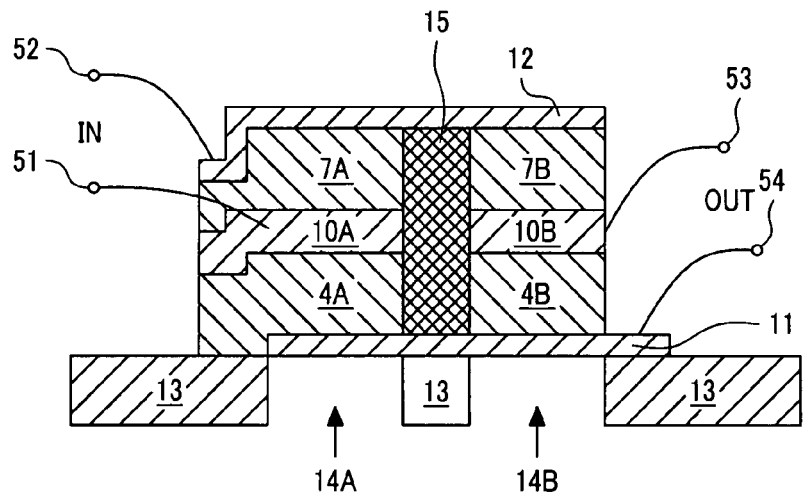
FIG. 12B is an A-A' section view of FIG. 12A.
Figure 12C:
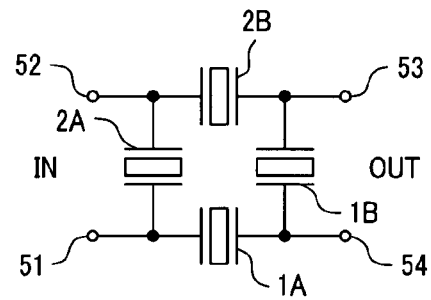
FIG. 12C shows an equivalent circuit to the embodiment shown in FIG. 12A.

FIG. 12A to FIG. 12C show a filter having BAW resonators, which constitute another embodiment of the invention. FIG. 12A is a plan view of the filter, FIG. 12B, an A-A' section of FIG. 12A; and FIG. 12C, an equivalent circuit diagram corresponding to the structure shown in FIG. 12A and FIG. 12B.

The filter of this embodiment is provided with the substrate 13, the first piezoelectric layer 4, the second piezoelectric layer 7, the first electrode 10, the second electrode 11 and the third electrode 12, and the first piezoelectric layer 4, the second piezoelectric layer 7 and the first electrode 10 are split by an insulating material 15 into two areas each (4A, 4B, 7A, 7B, 10A and 10B) in a plane at a right angle to the stacking direction. Preferably, the insulating material 15 is formed of silicon oxide, silicon nitride, alumina, tantalum oxide, titanium oxide, resist, polyimide or the like. The resonance frequency of each resonator is appropriately set by selecting a right film thickness for each piezoelectric layer or otherwise.

In this embodiment, one pair of thin film bulk acoustic wave resonators 2A and 2B are electrically connected to the input terminal 51 and an output terminal 53 via acoustic terminals, and the electrode 11 opposite the acoustic reflection layer 3 of the other pair of thin film bulk acoustic wave resonators 1A and 1B is electrically connected to an output terminal 54.

In this embodiment, by differentiating the film thicknesses of the first piezoelectric layer 4 and the second piezoelectric layer 7, the resonance frequency f1 of the resonators (1A and 1B) matching the first piezoelectric layer 4 and the resonance frequency f2 of the resonators (2A and 2B) matching the second piezoelectric layer 7 can be differentiated. Thus, as shown in FIG. 12C, a lattice filter having four BAW resonators (1A, 1B, 2A and 2B) can be configured in the structure shown in FIG. 12A and FIG. 12B. Thus, the first resonator 1A, the second resonator 1B, the third resonator 2A and the fourth resonator 2B are connected in a lattice shape between the terminals 51, 52, 53 and 54.

As the BAW resonator structure and filter of this embodiment can be fabricated by a usual thin film fabrication process in semiconductor manufacturing technology, they can be more easily manufactured at lower cost than conventional such products. Moreover, by arraying BAW resonators in the height direction, the element area can be substantially reduced.

Embodiment 6

Figure 13A:
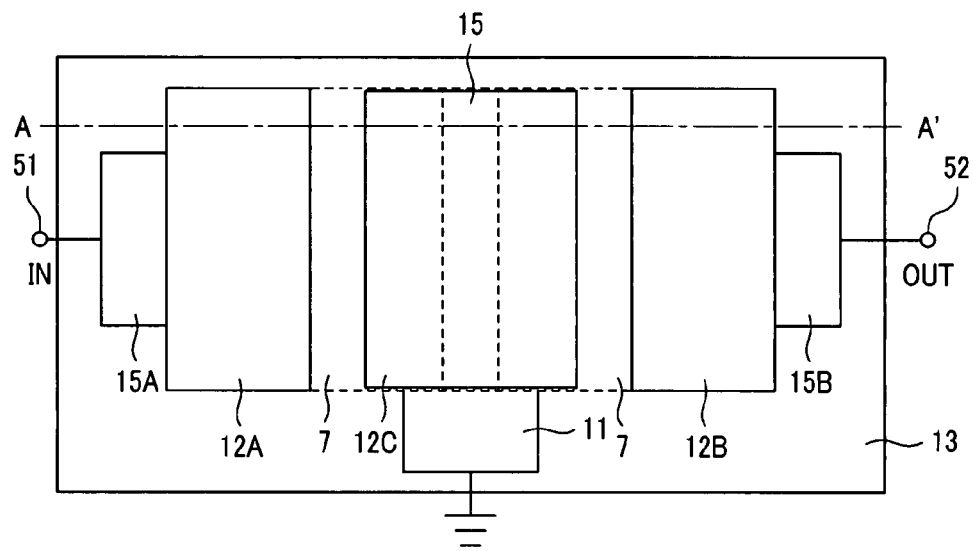
FIG. 13A is a plan view of a BAW filter, which is still another preferred embodiment of the invention.
Figure 13B:
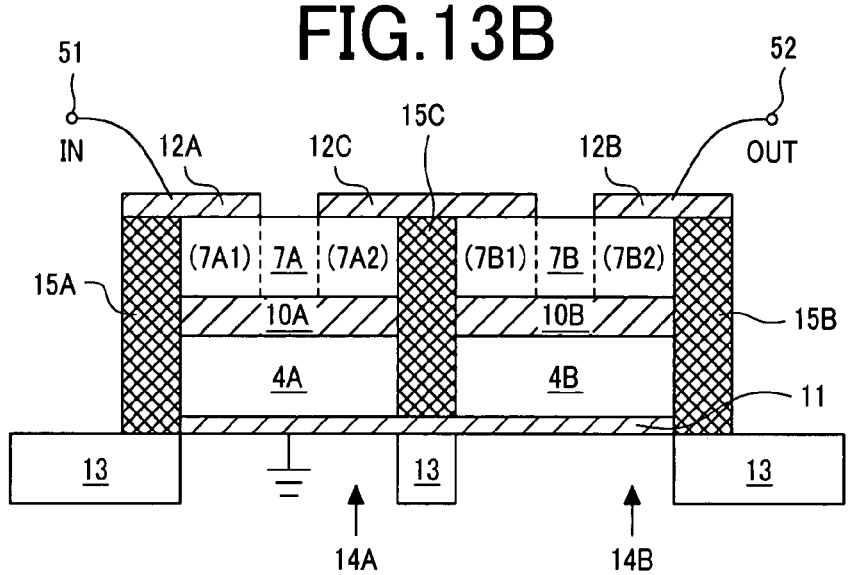
FIG. 13B is an A-A' section view of FIG. 13A.
Figure 13C:
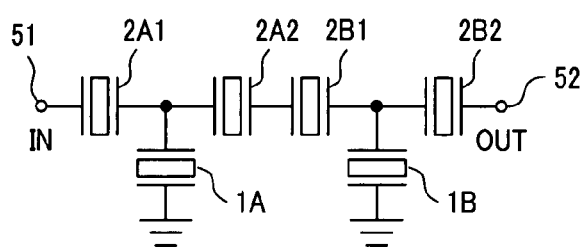
FIG. 13C shows an equivalent circuit to the embodiment shown in FIG. 13A.

FIG. 13A to FIG. 13C show a filter having BAW resonators, which constitute still another embodiment of the invention. FIG. 13A is a plan view of the filter, FIG. 13B, an A-A' section of FIG. 13A; and FIG. 13C, an equivalent circuit diagram corresponding to the structure shown in FIG. 13A and FIG. 13B.

In this embodiment, as in Embodiment 5, the first piezoelectric layer 4, the second piezoelectric layer 7, and first electrode 10 are split by the insulating material 15C into two areas each. Also, insulating materials 15A and 15B are arranged at the two ends. Further, as in Embodiment 4, the third electrode 12 positioned over the upper face of the second piezoelectric layer 7 is split into three (electrodes 12A, 12B and 12C), and there is a gap each in the planar direction between electrodes 12A and 12C and between electrodes 12B and 12C. The electrode 12A is connected to an input terminal, the second electrode 11 is connected to a ground terminal, and the electrode 12B is connected to an output terminal. The second piezoelectric layer 7 functions as a resonator substantially only in the areas (7A1), (7A2), (7B1) and (7B2) where the electrodes 12A, 12B and 12C are present. In this embodiment, by differentiating the film thicknesses of the first piezoelectric layer 4 and the second piezoelectric layer 7, the resonance frequency f1 of the resonator matching the first piezoelectric layer 4 and the resonance frequency f2 of the resonators (2A and 2B) matching the second piezoelectric layer 7 can be differentiated.

As a result, six resonators (1A, 1B, 2A1, 2A2, 2B1 and 2B2) are configured in the structures shown in FIG. 13A and FIG. 13B, and the filter circuit shown in FIG. 13C can be structured.

As the BAW resonator structure and filter of this embodiment can be fabricated by a usual thin film fabrication process in semiconductor manufacturing technology, they can be more easily manufactured at lower cost than conventional such products. Moreover, by arraying BAW resonators in the height direction, the element area can be substantially reduced.

Embodiment 7

Figure 14:
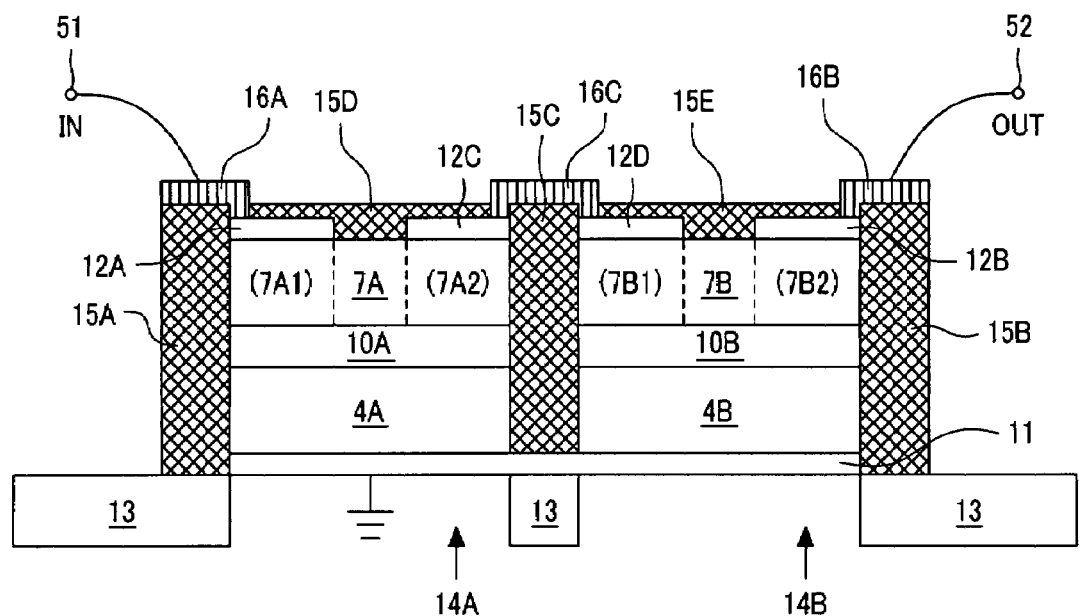
FIG. 14 is a longitudinal section view of a BAW filter, which is yet another preferred embodiment of the invention.

FIG. 14 shows a section of yet another preferred embodiment of the filter according to the invention, configured as a filter similar to what is shown in FIG. 13A to FIG. 13C. In the example of FIG. 14, the insulating materials 15D and 15E covers the upper face of the third electrode 12 and functions as a passivation layer to protect the element. Also, by using as the insulating materials 15D and 15E silicon oxide or the like whose temperature coefficient of the elastic constant is opposite to those of general materials, it is possible to compensate the temperature characteristic. In the example of FIG. 14, by removing part of the insulating materials 15D and 15E covering the third electrode 12 and adding an electroconductive material 16, adjoining BAW resonators are electrically connected. Namely, two areas of electrodes (12C and 12D) are electrically connected by the electroconductive material (16C) and other part of the electrodes (12A and 12B) are electrically connected to the input terminal 51 and the output terminal 52 by the electroconductive materials (16A and 16B) respectively.

In this embodiment, too, six resonators are configured and a filter circuit similar to what is shown in FIG. 13C can be structured.

As the BAW resonator structure and filter of this embodiment can be fabricated by a usual thin film fabrication process in semiconductor manufacturing technology, they can be more easily manufactured at lower cost than conventional such products. Moreover, by arraying BAW resonators in the height direction, the element area can be substantially reduced.

Embodiment 8

It is also possible to further strengthen the effect to reduce the element area by configuring a filter in which the resonators of the different embodiments so far described are connected in multiple stages. Thus, by arraying BAW resonators stacked in two more layers in the surface on the substrate, various circuits can be realized.

Figure 15A:
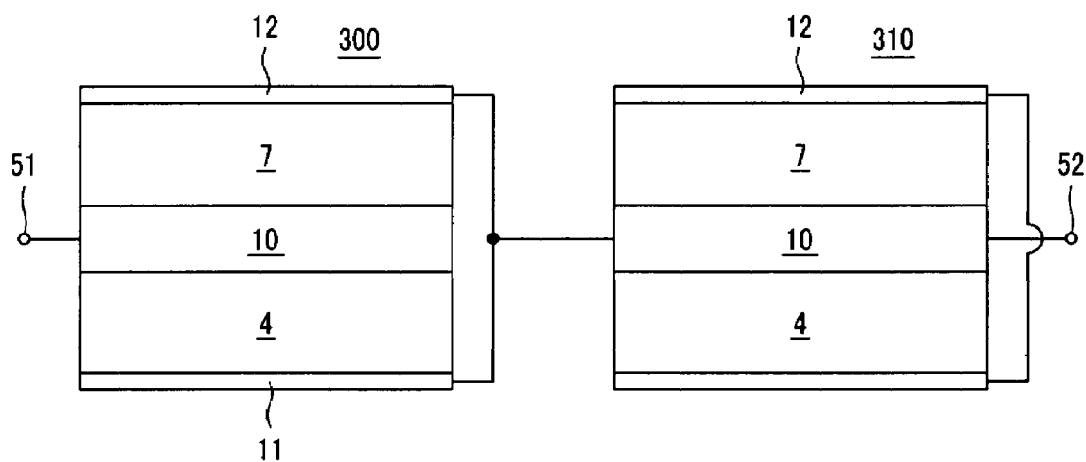
FIG. 15A shows an example of configuration of a BAW filter consisting of resonators arranged within a face on a substrate as another filter embodying the invention.
Figure 15B:
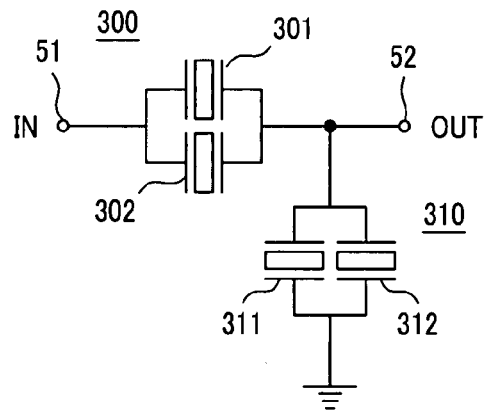
FIG. 15B shows an equivalent circuit to the embodiment shown in FIG. 15A.

FIG. 15A and FIG. 15B show still another filter embodying the invention. The filter of this embodiment is composed of a first BAW resonator section 300 and a second BAW resonator section 310 arrayed in the surface on the substrate. The filter of this embodiment including the first BAW resonator section 300 and the second BAW resonator section 310 has a configuration similar to any of the embodiments so far described, and fabricated by a similar method. The first electrode 10 of the first BAW resonator section 300 is connected to the input terminal 51, and the second electrode 11 and the third electrode 12 are connected to the first electrode 10 of the second BAW resonator section 310. This first electrode 10 of the second BAW resonator section 310 is connected to the output terminal 52. On the other hand, both the second electrode 11 and the third electrode 12 of the second BAW resonator section 310 are grounded (connected to the grounding wire).

In this embodiment, the two resonators in each BAW resonator section (301 and 302, and 311 and 312) are respectively connected in parallel, and the first BAW resonator section 300 and the second BAW resonator section 310 are so connected as to constitute a ladder-shaped filter circuit. The filter of this embodiment can be equivalently regarded as shown in FIG. 15B.

As a result the ladder-shaped filter circuit composed of four BAW resonators (301, 302, 311 and 312) can be realized in a smaller area than any such conventional element.

Figure 16A:
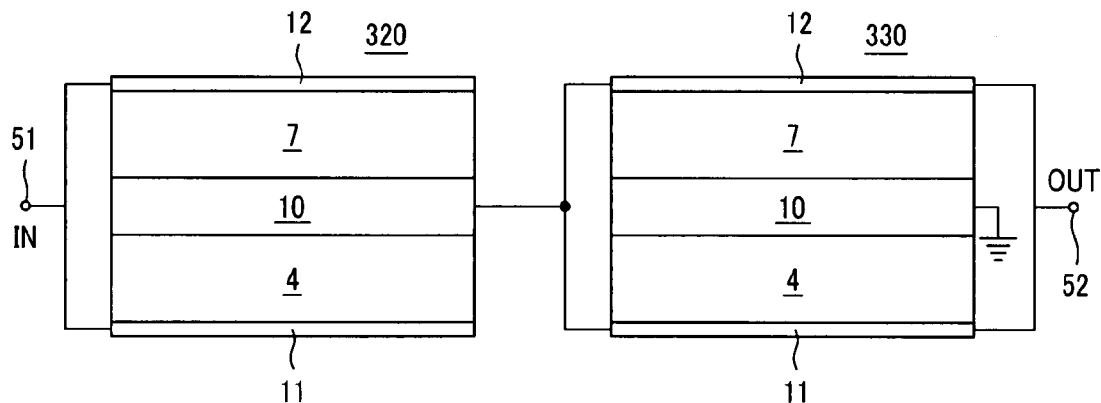
FIG. 16A shows an example of configuration of BAW filters arranged within a face on a substrate as still another filter embodying the invention.
Figure 16B:
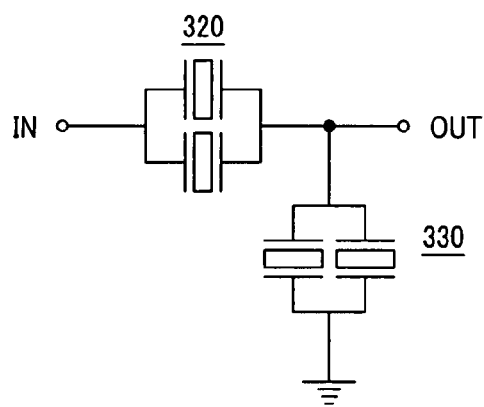
FIG. 16B shows an equivalent circuit to the embodiment shown in FIG. 16A.

Further, still another filter embodying the invention is shown in FIG. 16 (FIG. 16A and FIG. 16B). The filter of this embodiment is composed of the first BAW resonator section 320 and the second BAW resonator section 330. The second electrode 11 and the third electrode 12 of the first BAW resonator section 320 are connected to the input terminal 51, and the first electrode 10 is connected to the second electrode 11 and the third electrode 12 of the second BAW resonator section 330. Also, the second electrode 11 and the third electrode 12 of the second BAW resonator section 330 are connected to the output terminal 52. On the other hand, the first electrode 10 of the second BAW resonator section 330 is grounded.

In this embodiment, too, the two resonators in each BAW resonator section are connected in parallel, and the first BAW resonator section 300 and the second BAW resonator section 310 are so connected as to constitute a ladder-shaped filter circuit. The filter of this embodiment can be equivalently regarded as shown in FIG. 16B.

As a result the ladder-shaped filter circuit composed of four BAW resonators can be realized in a substantially smaller area than any such conventional element.

Embodiment 9

Whereas a structure in which BAW resonators are stacked in two stages via an electroconductive reflector layer has been described so far with respect to each of the embodiments, it is also possible to stack BAW resonators in three or more stages to achieve a higher level of integration.

Figure 17A:
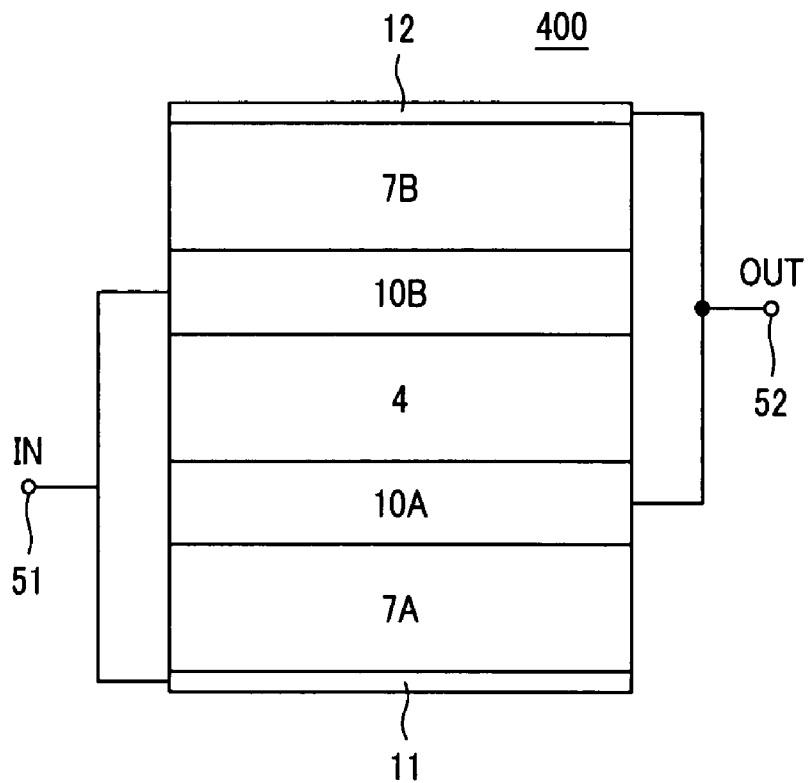
FIG. 17A shows an example of configuration of a BAW resonator arranged in three stages over a substrate as yet another resonator embodying the invention.
Figure 17B:
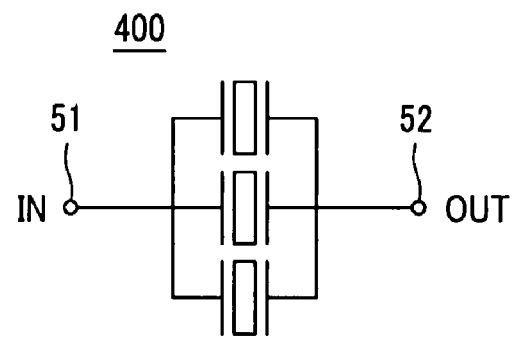
FIG. 17B shows an equivalent circuit to the embodiment shown in FIG. 17A.

First, FIG. 17A and FIG. 17B show an example of resonator structure in which BAW resonators are stacked in three stages.

A resonator structure 400 of this embodiment is configured of BAW resonators stacked in three stages.

The BAW resonators constituting the resonator of this embodiment has a similar configuration to any of the embodiments described so far, and the electrode 11 and the electrode 10B fabricated by a similar method are connected to the input terminal 51. On the other hand, the electrode 12 and the electrode 10A are connected to the output terminal 52.

The resonator of this embodiment can be equivalently regarded as shown in FIG. 17B. A parallel resonator circuit composed of three BAW resonators (400) can be realized in a substantially smaller area than any such conventional element. For instance, where the planar shape of the BAW resonator structure is square, the length of one side, which is 100 μm in the conventional one, would be $100/\sqrt{3} \approx 57.7$ μm to achieve a performance equal to the conventional one.

Figure 18A:
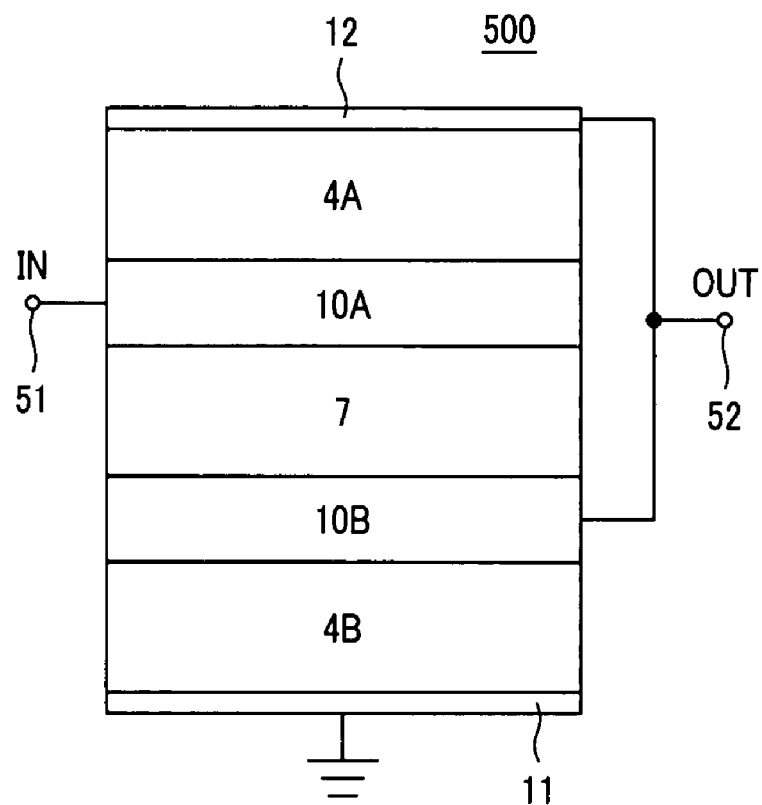
FIG. 18A shows another example of configuration of a BAW filter arranged in three stages over a substrate as yet another filter embodying the invention.
Figure 18B:
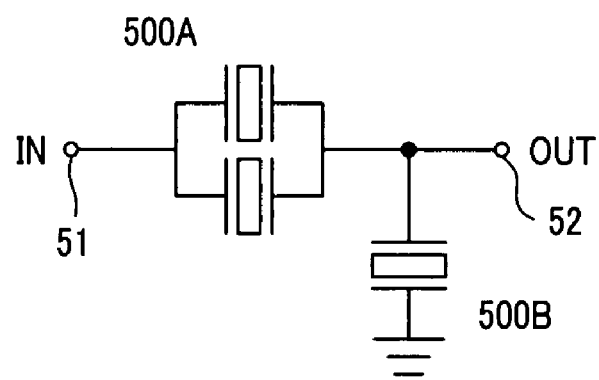
FIG. 18B shows an equivalent circuit to the embodiment shown in FIG. 18A.

Further, still another filter embodying invention is shown in FIG. 18A and FIG. 18B.

A resonator structure 500 of this embodiment has a similar configuration to any of the embodiments described so far, the electrode 10A fabricated by a similar method is connected to the input terminal 51. The electrode 12 and the electrode 10B are connected to the output terminal 52. On the other hand, the second electrode 11 is connected to a ground terminal.

The filter of this embodiment can be equivalently regarded as shown in FIG. 18B. As a result the ladder filter circuit composed of three BAW resonators (500A and 500B) can be realized in a substantially smaller area than any such conventional element.

Embodiment 10

Figure 19:
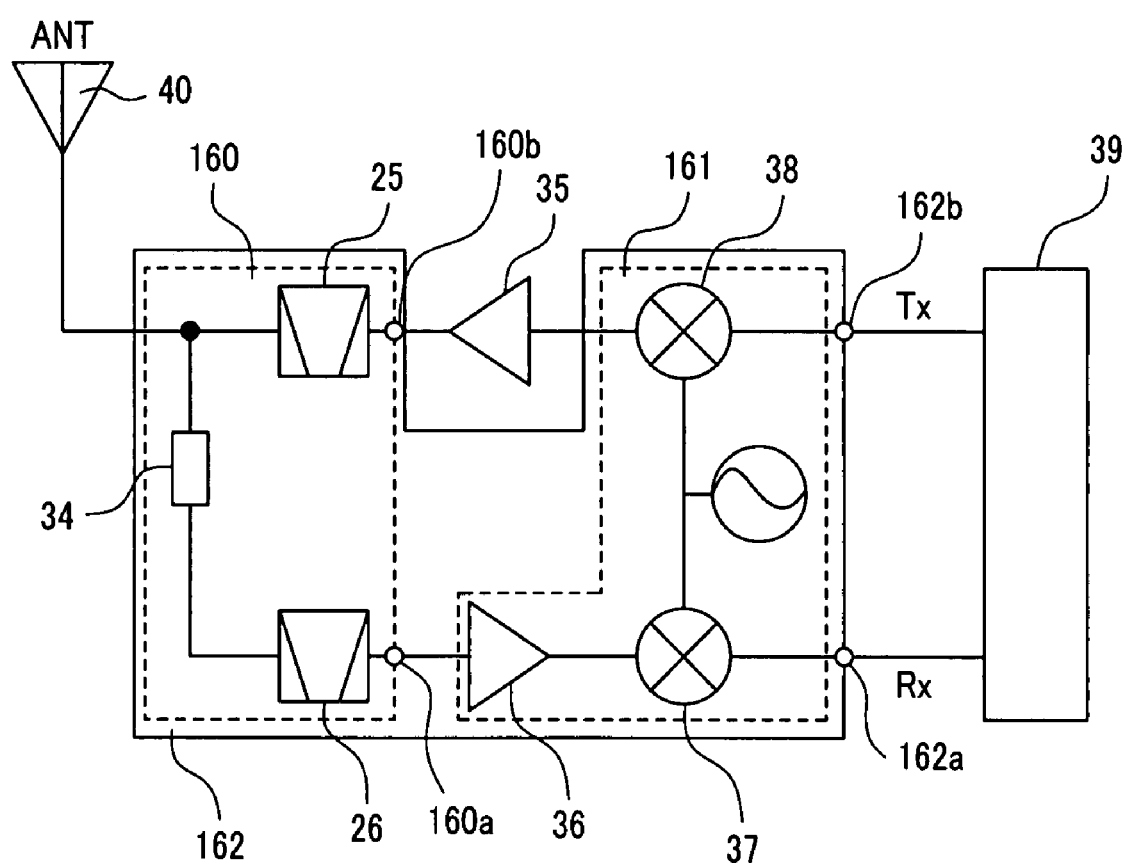
FIG. 19 is a block diagram of a radio-frequency module including the front end part in a usual mobile telephone.

Next, an embodiment of a radio-frequency module using a BAW filter according to the invention will be described with reference to FIG. 19. In FIG. 19, reference numeral 25 denotes a transmit filter and 26, a receive filter, each being a BAW filter according to the invention described with reference to FIG. 7C for instance. Reference numeral 34 denotes a phase shifter; 35, a power amplifier; 36, a low noise amplifier; 37, a receive mixer; 38, a transmit mixer; 39, a baseband section; 40, an antenna for transmission and reception; 160, a front end section; 161, a radio-frequency integrated circuit section; and 162, an RF module.

In the block circuit of FIG. 19, the front end section 160, the radio-frequency integrated circuit section 161 and the power amplifier 35 are modularized as a chip set for mobile telephone use. It is also conceivable to modularize only the front end section 160, and in this case it is connected to the radio-frequency integrated circuit section 161 and the power amplifier 35 via terminals 160a and 160b. It is also acceptable to modularize the front end section 160 and the radio-frequency integrated circuit section 161, and in this case the radio-frequency module 162 is connected to the baseband section 39 via terminals 162a and 162b.

Since a BAW filter of one or another of the embodiments of the invention so far described is used in this embodiment, it is possible to reduce the element area, make the radio-frequency module compact and achieve a price reduction.

What is claimed is:

1. A thin film bulk acoustic wave resonator structure comprising:
   a substrate;
   at least one acoustic reflection layer;
   a plurality of thin film bulk acoustic wave resonators stacked with the acoustic reflection layer in-between and disposed over the substrate;
   an input terminal; and
   an output terminal,
   wherein each of the thin film bulk acoustic wave resonators has a piezoelectric layer and a pair of electrodes stacked with the piezoelectric layer in-between,
   wherein the acoustic reflection layer is electroconductive, and two of the thin film bulk acoustic wave resonators stacked with the acoustic reflection layer in-between are electrically connected via the acoustic reflection layer,
   wherein at least one of the thin film bulk acoustic wave resonators is electrically connected between the input terminal and the output terminal via the acoustic reflection layer, and
   wherein the acoustic reflection layer is a Bragg reflection layer which includes a combination of a high-impedance metal layer and a low-impedance metal layer.

2. A thin film bulk acoustic wave resonator structure comprising:
   a substrate;
   at least one acoustic reflection layer;
   a plurality of thin film bulk acoustic wave resonators stacked with the acoustic reflection layer in-between and disposed over the substrate;
   an input terminal; and
   an output terminal,
   wherein each of the thin film bulk acoustic wave resonators has a piezoelectric layer and a pair of electrodes stacked with the piezoelectric layer in-between,
   wherein the acoustic reflection layer is electroconductive, and two of the thin film bulk acoustic wave resonators stacked with the acoustic reflection layer in-between are electrically connected via the acoustic reflection layer,
   wherein at least one of the thin film bulk acoustic wave resonators is electrically connected between the input terminal and the output terminal via the acoustic reflection layer,
   wherein the plurality of thin film bulk acoustic wave resonators include
      a first thin film bulk acoustic wave resonator stacked over the substrate, the acoustic reflection layer being stacked over the first thin film bulk acoustic wave resonator, and
      a second thin film bulk acoustic wave resonator stacked over the acoustic reflection layer,
   wherein the first thin film bulk acoustic wave resonator comprises
      a first piezoelectric layer, and
      a first metal layer and a second metal layer respectively stacked underneath the lower face and over the upper face of the first piezoelectric layer,
   wherein the second thin film bulk acoustic wave resonator comprises
      a second piezoelectric layer, and
      a third metal layer and a fourth metal layer respectively stacked underneath the lower face and over the upper face of the second piezoelectric layer,
   wherein a stacked conductor including the acoustic reflection layer, the second metal layer and the third metal layer functions as a first electrode, the first metal layer functions as a second electrode, and the fourth metal layer functions as a third electrode,
   wherein the first thin film bulk acoustic wave resonator and the second thin film bulk acoustic wave resonator are electrically connected by the first electrode, and
   wherein the substrate has a cavity which opens in the face over which the first thin film bulk acoustic wave resonator is stacked, and the second electrode has a part overlapping with the cavity.

* * * * *